US012712024B2

(12) United States Patent
Hu et al.

(10) Patent No.: US 12,712,024 B2
(45) Date of Patent: Aug. 18, 2026

(54) MEMORY, MEMORY PROGRAMMING METHOD AND MEMORY SYSTEM

(71) Applicant: YANGTZE MEMORY TECHNOLOGIES CO., LTD., Wuhan (CN)

(72) Inventors: Man Hu, Wuhan (CN); HongTao Liu, Wuhan (CN); XiangNan Zhao, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 110 days.

(21) Appl. No.: 18/935,014

(22) Filed: Nov. 1, 2024

(65) Prior Publication Data

US 2026/0004851 A1 Jan. 1, 2026

(30) Foreign Application Priority Data

Jun. 27, 2024 (CN) ......................... 202410845888.2

(51) Int. Cl.
*G11C 16/10* (2006.01)
*G11C 16/08* (2006.01)
*G11C 16/34* (2006.01)

(52) U.S. Cl.
CPC ............ *G11C 16/102* (2013.01); *G11C 16/08* (2013.01); *G11C 16/3459* (2013.01)

(58) Field of Classification Search
CPC .................................................. G11C 7/1042
See application file for complete search history.

(56) References Cited

U.S. PATENT DOCUMENTS

2023/0126944 A1* 4/2023 Mirichigni ........... G11C 7/1042 365/230.06

* cited by examiner

*Primary Examiner* — Jason Lappas
(74) *Attorney, Agent, or Firm* — Conley Rose, P.C.

(57) ABSTRACT

The present application discloses a memory, a memory operation method and a memory system. The memory includes: a memory array and a peripheral circuit, wherein the memory array includes a plurality of memory cells coupled to a first bit line and to a plurality of word lines respectively, wherein the plurality of word lines include a selected word line coupled to a memory cell to be programmed; the peripheral circuit is configured to: apply precharge voltages to the plurality of word lines; sequentially reduce the precharge voltages applied to the plurality of word lines to a first turn-off voltage according to the arrangement order of the memory cells coupled to the plurality of word lines in the memory array; apply a program voltage to a selected word line in the plurality of word lines, and apply a turn-on voltage to other word lines in the plurality of word lines.

20 Claims, 12 Drawing Sheets

MEMORY, MEMORY PROGRAMMING METHOD AND MEMORY SYSTEM

CROSS-REFERENCE TO RELATED APPLICATION

This patent application claims priority to Chinese Patent Application No. 202410845888.2, which was filed on Jun. 27, 2024 and is incorporated herein by reference in its entirety.

TECHNICAL FIELD

The present application relates to the field of memory technology, and in particular to a memory, a memory programming method, and a memory system.

BACKGROUND

Three-dimensional (3D) memory typically comprises multiple array-arranged memory strings, each of which includes multiple memory cells with layers being connected in serial. With the development of communication technology and big data technology, users' demand for memory capacity is gradually increasing. Since memory capacity is affected by the number of memory string layers, the number of memory string layers is also required to be increased accordingly.

SUMMARY

The present application provides a memory, a memory programming method and a memory system. Examples of technical solutions are as follows:

In one aspect, a memory is provided, the memory comprising:

a memory array and a peripheral circuit, the memory array comprising a plurality of memory cells coupled to a first bit line and to a plurality of word lines respectively, the plurality of word lines comprising a selected word line coupled to a memory cell to be programmed;

the peripheral circuit is configured to:

apply precharge voltages to the plurality of word lines;

sequentially reduce the precharge voltages applied to the plurality of word lines to a first turn-off voltage, according to the arrangement order of the memory cells coupled to the plurality of word lines in the memory array;

apply a program voltage to the selected word line in the plurality of word lines, and apply a turn-on voltage to other word lines in the plurality of word lines.

In some examples, the peripheral circuit is further configured to:

apply the first turn-off voltage to the plurality of word lines one by one according to the arrangement order of the memory cells coupled to the plurality of word lines in the memory array; or apply the first turn-off voltage to the plurality of word lines in groups according to the arrangement order of the memory cells coupled to the plurality of word lines in the memory array.

In some examples, the peripheral circuit is further configured to:

obtain group configuration information of the plurality of word lines, the group configuration information includes a plurality of groups which the plurality of word lines are divided into, wherein at least two word lines in a same group are arranged adjacently in the memory array;

sequentially apply the first turn-off voltage to the word lines in a plurality of groups in the unit of group according to the arrangement order of the memory cells coupled to the plurality of word lines in the memory array.

In some examples, the peripheral circuit is further configured to:

the precharge voltages applied to the plurality of word lines are sequentially reduced to a first intermediate voltage, according to the arrangement order of the memory cells coupled to the plurality of word lines in the memory array, wherein the first intermediate voltage is a voltage between the precharge voltage and the first turn-off voltage;

the first intermediate voltage applied to the plurality of word lines are sequentially reduced to the first turn-off voltage, according to the arrangement order of the memory cells coupled to the plurality of word lines in the memory array.

In some examples, the peripheral circuit is further configured to:

sequentially reduce the precharge voltages applied to the plurality of word lines to the first turn-off voltage along the direction from the drain select gate to the source select gate; or sequentially reduce the precharge voltages applied to the plurality of word lines to the first turn-off voltage along the direction from the source select gate to the drain select gate.

In some examples, the plurality of word lines include a selected word line coupled to the memory cell to be programmed and a deselected word line coupled to the programmed memory cell.

In some examples, the peripheral circuit is further configured to:

apply a verification voltage to the selected word line in the plurality of word lines, and apply a read voltage to other word lines in the plurality of word lines;

sequentially apply a second turn-off voltage to the plurality of word lines according to the arrangement order of the memory cells coupled to the plurality of word lines in the memory array;

apply a program voltage to the selected word line in the plurality of word lines, and apply a turn-on voltage to other word lines in the plurality of word lines.

In some examples, the peripheral circuit is further configured to:

sequentially reduce the verification voltages or read voltages applied to the plurality of word lines to a second intermediate voltage according to the arrangement order of the memory cells coupled to the plurality of word lines in the memory array, wherein the second intermediate voltage is a voltage between the verification voltage and the second turn-off voltage, or the second intermediate voltage is a voltage between the read voltage and the second turn-off voltage;

sequentially reduce the second intermediate voltages applied to the plurality of word lines to the second turn-off voltage according to the arrangement order of the memory cells coupled to the plurality of word lines in the memory array.

In some examples, the peripheral circuit is further configured to:

sequentially reduce the precharge voltages applied to a portion of the plurality of word lines to the first turn-off voltage with a preset word line interval according to the arrangement order of the memory cells coupled to the plurality of word lines in the memory array.

In some examples, the peripheral circuit is further configured to:

determine a plurality of target word lines from the plurality of word lines according to a preset interval algorithm, wherein two adjacent target word lines are separated with at least one word line;

sequentially reduce the precharge voltages applied to the plurality of target word lines is to the first turn-off voltage according to the arrangement order of the memory cells coupled to the plurality of target word lines in the memory array.

In some examples, the peripheral circuit is further configured to:

after the plurality of word lines are reduced to the first turn-off voltage, apply a program voltage to the selected word line in the plurality of word lines, and apply a turn-on voltage to other word lines in the plurality of word lines at the same time.

In another aspect, a method of programming a memory is provided, the method comprising:

applying precharge voltages to a plurality of word lines;

sequentially reducing the precharge voltages applied to the plurality of word lines to a first turn-off voltage according to the arrangement order of the memory cells coupled to the plurality of word lines in the memory array;

applying a program voltage to the selected word line in the plurality of word lines, and applying a turn-on voltage to other word lines in the plurality of word lines.

In some examples, sequentially reducing the precharge voltages applied to the plurality of word lines to a first turn-off voltage according to the arrangement order of the memory cells coupled to the plurality of word lines in the memory array comprises:

applying the first turn-off voltage to the plurality of word lines one by one according to the arrangement order of the memory cells coupled to the plurality of word lines in the memory array; or applying the first turn-off voltage to the plurality of word lines in groups according to the arrangement order of the memory cells coupled to the plurality of word lines in the memory array.

In some examples, applying the first turn-off voltage to the plurality of word lines in groups according to the arrangement order of the memory cells coupled to the plurality of word lines in the memory array comprises:

obtaining group configuration information of the plurality of word lines, the group configuration information including a plurality of groups which the plurality of word lines are divided into, wherein at least two word lines in a same group are arranged adjacently in the memory array;

sequentially applying the first turn-off voltage to the word lines in a plurality of groups in the unit of group according to the arrangement order of the memory cells coupled to the plurality of word lines in the memory array.

In some examples, sequentially reducing the precharge voltages applied to the plurality of word lines to the first turn-off voltage according to the arrangement order of the memory cells coupled to the plurality of word lines in the memory array comprises:

sequentially reducing the precharge voltages applied to the plurality of word lines to a first intermediate voltage according to the arrangement order of the memory cells coupled to the plurality of word lines in the memory array, wherein the first intermediate voltage is a voltage between the precharge voltage and the first turn-off voltage;

sequentially reducing the first intermediate voltages applied to the plurality of word lines to the first turn-off voltage according to the arrangement order of the memory cells coupled to the plurality of word lines in the memory array.

In some examples, sequentially reducing the precharge voltages applied to the plurality of word lines to the first turn-off voltage according to the arrangement order of the memory cells coupled to the plurality of word lines in the memory array comprises:

sequentially reducing the precharge voltages applied to the plurality of word lines to the first turn-off voltage along the direction from the drain select gate to the source select gate; or sequentially reducing the precharge voltages applied to the plurality of word lines to the first turn-off voltage along the direction from the source select gate to the drain select gate.

In some examples, the plurality of word lines include a selected word line coupled to the memory cell to be programmed and a deselected word line coupled to the programmed memory cell.

In some examples, the method further comprises:

applying a verification voltage to the selected word line in the plurality of word lines, and applying a read voltage to other word lines in the plurality of word lines;

sequentially applying a second turn-off voltage to the plurality of word lines according to the arrangement order of the memory cells coupled to the plurality of word lines in the memory array;

applying a program voltage to the selected word line in the plurality of word lines, and applying a turn-on voltage to other word lines in the plurality of word lines.

In some examples, sequentially applying the second turn-off voltage to the plurality of word lines according to the arrangement order of the memory cells coupled to the plurality of word lines in the memory array comprises:

sequentially reducing the verification voltages or read voltages applied to the plurality of word lines to a second intermediate voltage according to the arrangement order of the memory cells coupled to the plurality of word lines in the memory array, wherein the second intermediate voltage is a voltage between the verification voltage and the second turn-off voltage, or the second intermediate voltage is a voltage between the read voltage and the second turn-off voltage;

sequentially reducing the second intermediate voltages applied to the plurality of word lines to the second turn-off voltage according to the arrangement order of the memory cells coupled to the plurality of word lines in the memory array.

In some examples, sequentially reducing the precharge voltages applied to the plurality of word lines to the first turn-off voltage according to the arrangement order of the memory cells coupled to the plurality of word lines in the memory array comprises:

sequentially reducing the precharge voltages applied to a portion of the plurality of word lines to the first turn-off voltage with a preset word line interval according to the arrangement order of the memory cells coupled to the plurality of word lines in the memory array.

In some examples, sequentially reducing the precharge voltages applied to a portion of the plurality of word lines to the first turn-off voltage with a preset word line interval according to the arrangement order of the memory cells coupled to the plurality of word lines in the memory array comprises:

determining a plurality of target word lines from the plurality of word lines according to a preset interval algorithm, wherein two adjacent target word lines are separated with at least one word line;

sequentially reducing the precharge voltages applied to the plurality of target word lines to the first turn-off voltage according to the arrangement order of the memory cells coupled to the plurality of target word lines in the memory array.

In some examples, applying the program voltage to the selected word line in the plurality of word lines, and applying the turn-on voltage to other word lines in the plurality of word lines comprises:

after the plurality of word lines are reduced to the first turn-off voltage, applying the program voltage to the selected word line in the plurality of word lines, and applying the turn-on voltage to other word lines in the plurality of word lines at the same time.

In another aspect, a memory system is provided, the memory system comprising:

one or more memories as described in any of the above examples, and a memory controller coupled to the memory and configured to control the memory.

The technical solution provided by the present application may include the following beneficial effects:

When programming a selected word line, after applying a precharge voltage in the precharge stage, the precharge voltages applied to the word lines are sequentially reduced to a preset turn-off voltage according to the arrangement order of plurality of word lines. Since the precharge voltages on the word lines are sequentially turned off, when the first word line is turned off, the second word line adjacent to the first word line has not been turned off, thereby generating a potential difference from the first word line to the second word line in the channel, thereby driving the electrons in the channel to move from the direction of the first word line to the direction of the second word line, and as the plurality of word lines are sequentially turned off, the electrons in the channel are driven to move from the channel to one end and be drawn away, thereby avoiding the electrons in the channel affecting the voltage difference between the word line and the channel, thereby affecting the programming effect of the erased state L0 after the precharge stage, and reducing the programming interference of L0.

BRIEF DESCRIPTION OF THE DRAWINGS

In order to more clearly illustrate the technical solutions in the examples of the present application, the following will briefly introduce the drawings required for the description of the examples. The drawings described below are only some examples of the present application. For ordinary people skilled in the art, other drawings can be obtained based on these drawings without creative work.

DETAILED DESCRIPTION

The following is a further detailed description of implementations of the present application in conjunction with the accompanying drawings.

The programming method of the memory provided in the example of the present application can be applied to the memory. The memory can be a 3D memory, for example, a 3D NAND flash memory.

Figure 1:
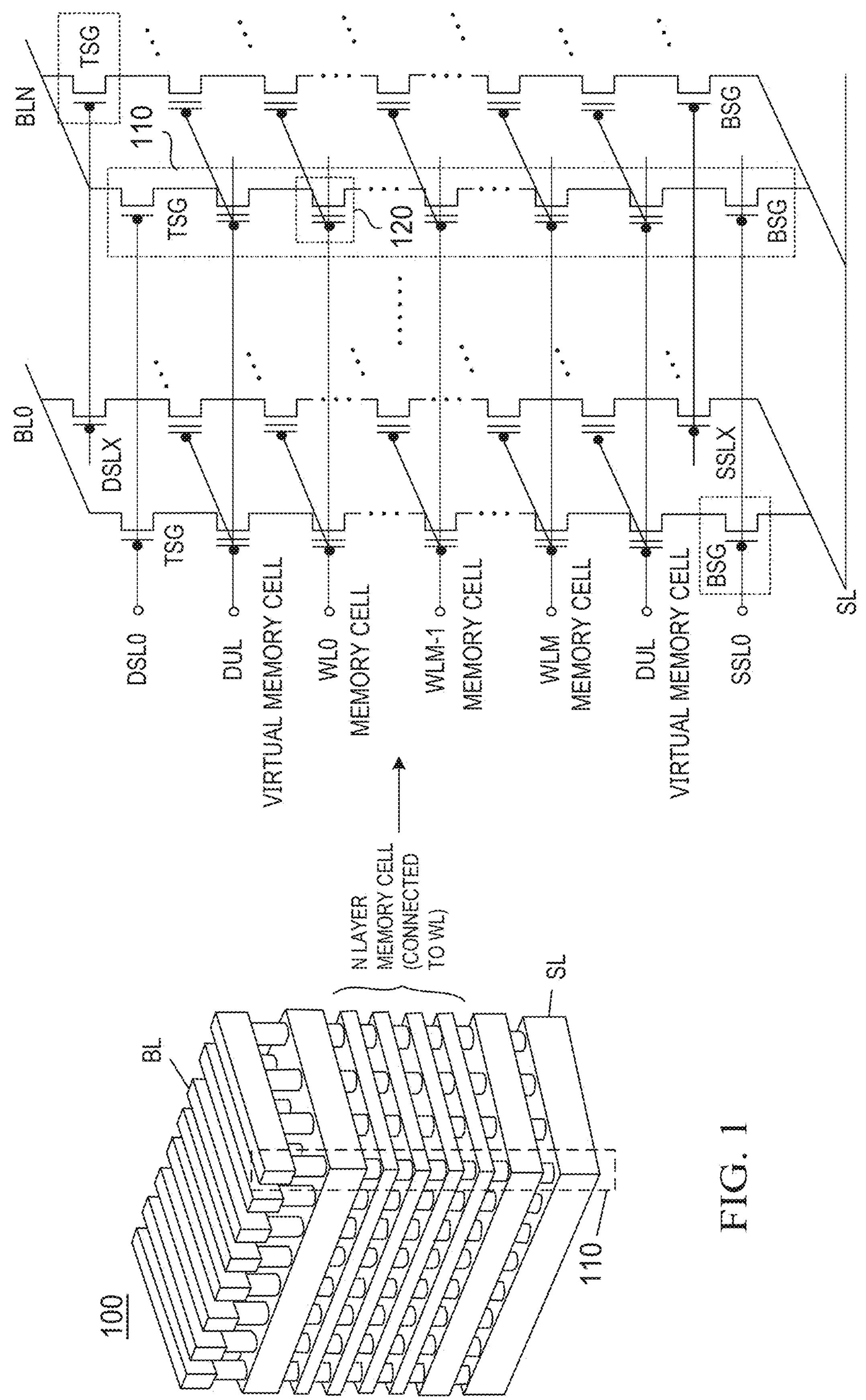
FIG. 1 is a schematic diagram of the structure of a 3D memory provided by an illustrated example of the present application.

A three-dimensional (3D) memory is a multi-layer stacked memory. In some examples, the 3D memory is a 3D NAND flash memory. As shown in FIG. 1, the multiple memory strings 110 (strings) included in the 3D memory 100 are arranged in a direction parallel to the bearing surface of the substrate, and the multiple memory cells 120 in each memory string 110 are arranged in a direction perpendicular to the bearing surface of the substrate. That is, the multiple memory cells included in the 3D memory are arranged in a three-dimensional array on the substrate to form a memory array.

One end of the memory string 110 is connected to a bit line (Bite Line, BL), and the other end is connected to a source line (Source Line, SL).

The memory cells in each memory string are also connected to the memory cells in other memory strings through a word line (Word Line, WL). For example, each memory string may include 64 memory cells, and the 3D memory may include 64 word lines WL<63:0>, each word line is connected to some memory cells located at the same layer (i.e., at the same height relative to the substrate). It should be noted that 64 memory cells are only a specific example, and the application is not limited thereto. In some examples, each memory string may include more than 64 memory cells, such as 128, 196, etc. In a 3D memory, each memory cell connected to the same word line is called a memory page, and all memory strings sharing a set of word lines are called a memory block.

The memory string 110 also includes an upper select tube connected to the drain of the first memory cell, and a lower select tube connected to the source of the last memory cell. Among them, the upper select tube is also called a top select gate (TSG) or a drain select gate (DSG). The lower select tube is also called a bottom select gate (BSG) or a source select gate (SSG).

The gate of TSG is connected to the drain select line (DSL), the source of TSG is connected to the drain of the first memory cell, and the drain of TSG is connected to the bit line.

The gate of BSG is connected to the source select line (SSL), the drain of BSG is connected to the source of the last memory cell, and the source of BSG is connected to the source line.

As shown in FIG. 1, the memory cells in the memory string 110 share a set of WLs with the memory cells in other memory strings. Assuming that each memory string includes m+1 memory cells, the 3D memory may include m+1 WLs: WL0 to WLm, where m is an integer greater than 1. Among them, each WL is connected to each memory cell located in the same layer (i.e., having the same height relative to the supporting surface of the substrate). Alternatively, it can be understood that the control gates of each memory cell located in the same layer and the gate connection lines between each control gate constitute a WL.

According to the amount of data that the memory cell can store, the types of memory cells can be divided into single-level memory cells (SLC), multi-level memory cells (MLC), tri-level memory cells (TLC) and quad-level memory cells (QLC). Among them, each SLC can store 1 bit of data, each MLC can store 2 bits of data, each TLC can store 3 bits of data, and each QLC can store 4 bits of data. In a 3D memory, the data stored in each memory cell located in the same layer can form k memory pages. Among them, k is the number of bits of data that each memory cell can store.

In an example of the present application, the memory cell in the 3D memory can be a floating gate field effect transistor or a charge trap field effect transistor that can store data. TSG and BSG can be ordinary field effect transistors, or they can also be field effect transistors that can store data. Among them, the floating gate field effect transistor includes a source, a drain and two gates. The two gates are conductors, and one of the two gates is a control gate (CG), and the other gate is a floating gate (FG), referred to as a floating gate. The control gate is to connect the word line, and the floating gate is to store data. The charge capture field effect transistor includes a source, a drain, a control gate and a charge capture layer, and the charge capture layer is a mean for storing data, and the charge capture layer is made of an insulating material such as silicon nitride. The following takes the floating gate field effect transistor as an example to introduce the data writing principle of the memory cell.

When writing data to the memory cell, a program voltage can be applied to the control gate of the floating gate field effect transistor so that the electrons in the channel of the floating gate field effect transistor tunnel to the floating gate. By controlling the magnitude of the program voltage, the number of electrons tunneling to the floating gate can be controlled, and then the magnitude of the threshold voltage Vth of the floating gate field effect transistor can be controlled. Generally, the higher the amount of charge stored in the floating gate, the higher the threshold voltage Vth of the floating gate field effect transistor. It is understandable that when the threshold voltage Vth of the floating gate field effect transistor is different, the voltage required to be loaded on the control gate of the floating gate field effect transistor to control the turn-on of the floating gate field effect transistor is different. Therefore, the magnitude of the threshold voltage Vth of the floating gate field effect transistor can reflect the content of the data stored in it.

It should be understood that in a 3D memory, the channels of each memory cell in each memory string can be sequentially connected and form a columnar structure perpendicular to the substrate.

Figure 2:
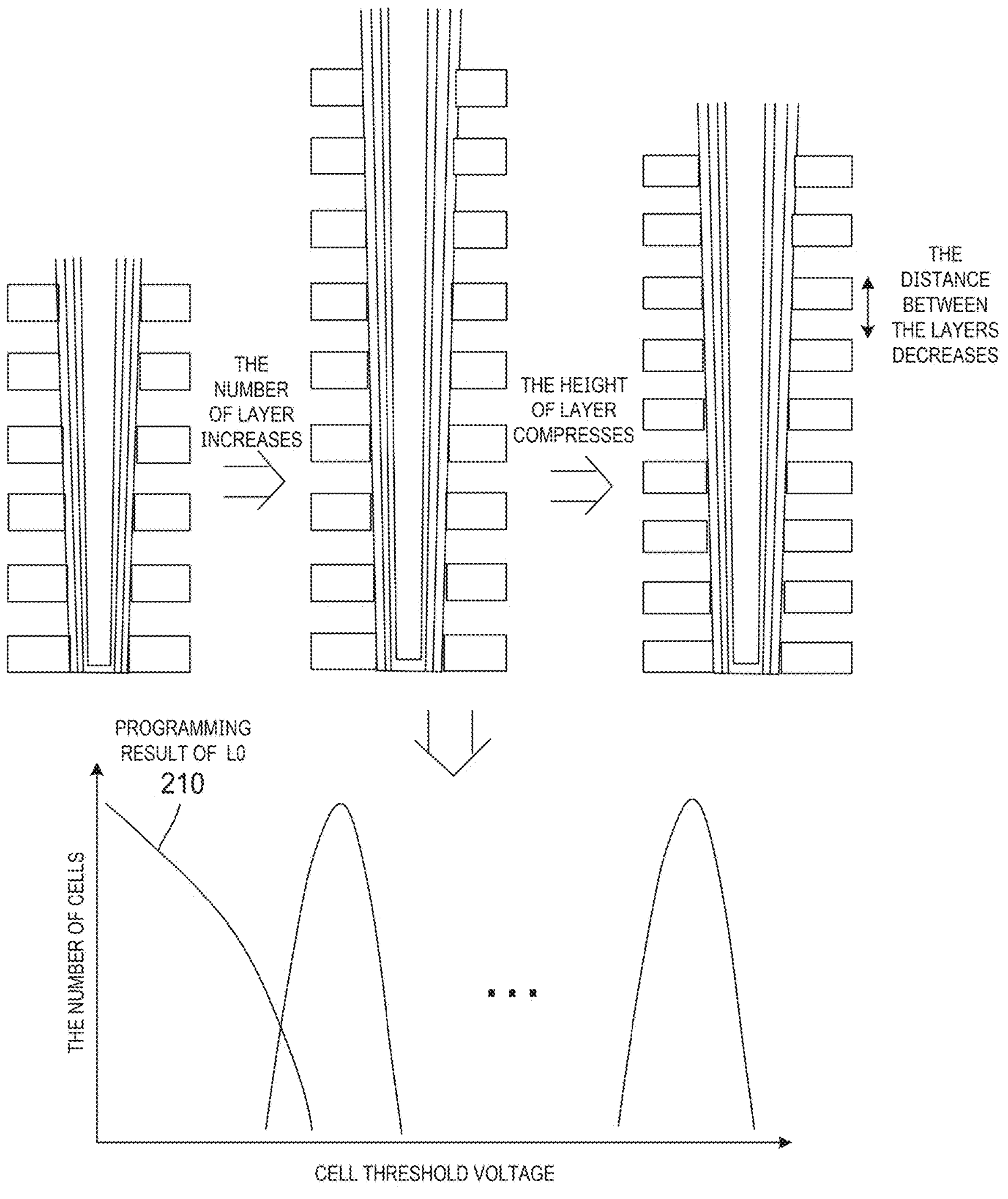
FIG. 2 is a schematic diagram of a programming result provided by an illustrated example of the present application.

As the number of layers of the 3D memory string increases, the distance between the layers decreases, resulting in serious programming interference between WLs during memory programming. In some examples, please refer to FIG. 2. With the development of 3D memory technology, the number of memory cell layers in the memory string increases, resulting in a longer length of the memory string. In order to compress the space occupied by the 3D memory string, the layer height of the memory string is compressed, resulting in a reduction in the distance between the memory cell layers in the memory string.

The reduction in the distance between the memory cell layers will cause interference between adjacent WLs during the programming of the memory cell, thereby interfering with the programming effect of the memory cell. Among them, when programming the memory cell, it is necessary to program the erased state L0 and multiple program states separately according to the type of the memory cell, and the programming process of the erased state will cause interference in the programming result of the erased state L0 due to the influence between adjacent WLs. As shown in the L0 programming result shown in FIG. 2, curve 210 represents the programming result of the erased state L0. There is an intersection between the curve 210 and other curves (representing the program state), indicating that there is interference in the programming result of the erased state L0.

The reasons for the L0 programming interference include the following: in the potential boosting stage, it is usually necessary to increase the boosting potential of the channel near the selected word line to a preset height, thereby reducing the voltage difference between the selected word line and the channel, and reducing the L0 programming interference caused by electron tunneling. However, the residual electrons in the channel will reduce the boosting potential, resulting in the L0 programming interference is still relatively obvious.

Figure 3:
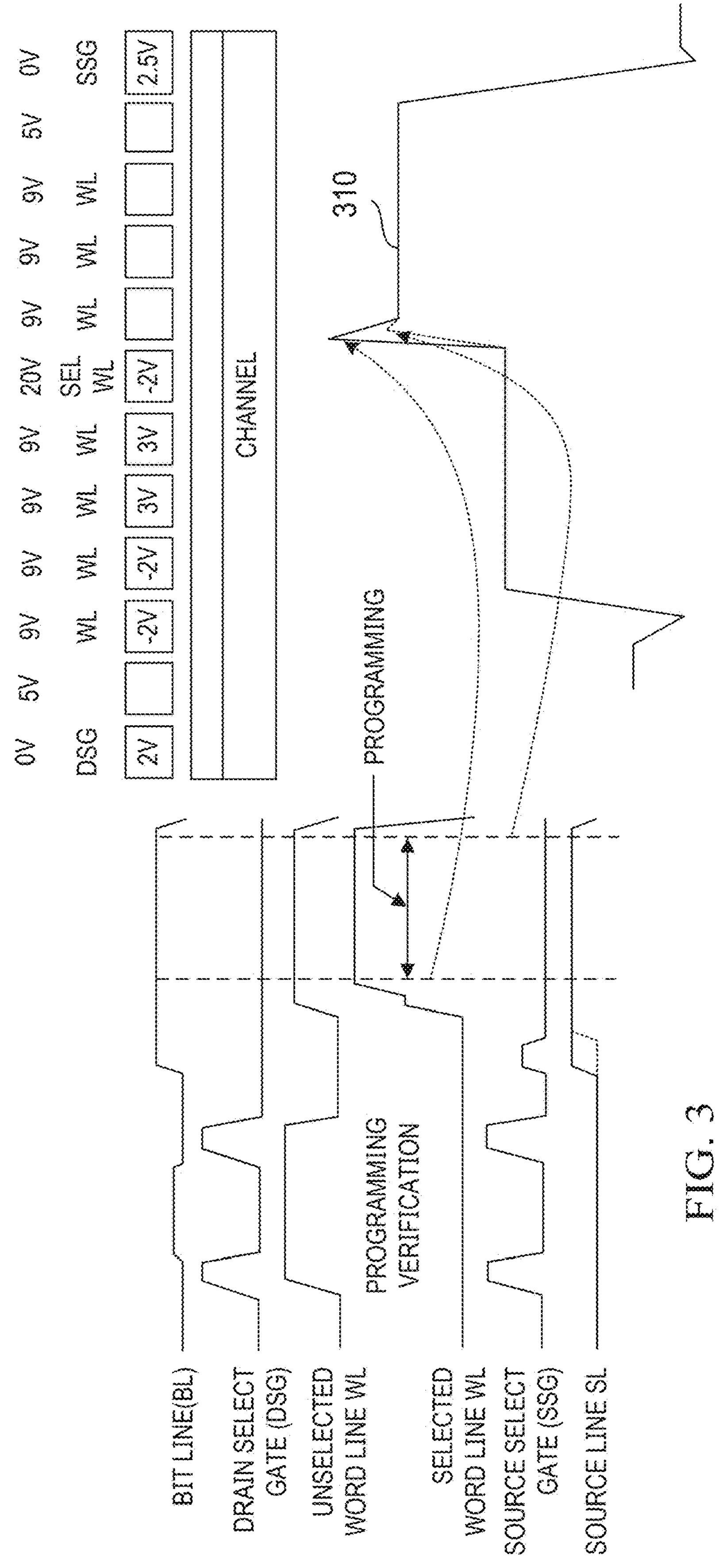
FIG. 3 is a schematic diagram of another programming result provided by an illustrated example of the present application.

In some examples, please refer to FIG. 3, where curve 310 expresses the channel potential. After the selected word line is programmed, the boosting potential is reduced due to the residual electrons in the channel, thereby affecting the programming effect of the subsequent word line during programming, so that the subsequent word line has L0 programming interference during programming.

In the example of the present application, by sequentially applying the turn-off voltage to the word line in the pre-charging stage, the electrons in the channel are discharged from the channel along the order of applying the turn-off voltage, thereby keeping the boosting potential in the channel from being reduced, and avoiding the L0 programming interference generated when the selected word line is programmed.

Figure 4:
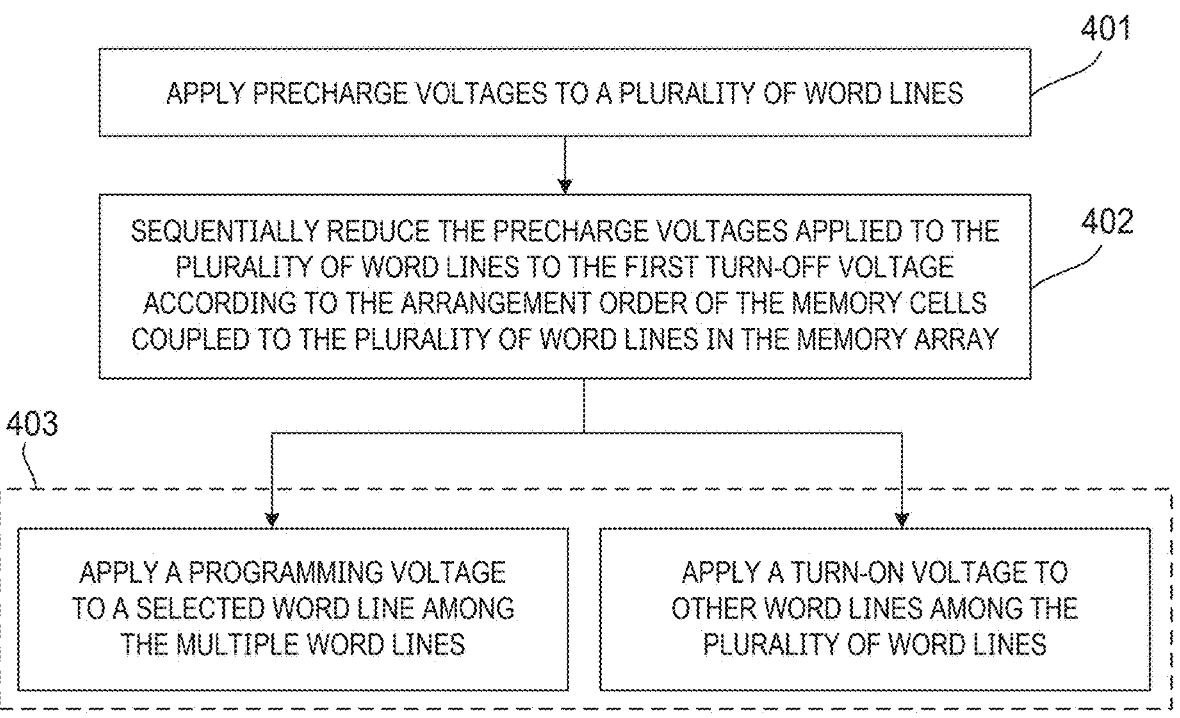
FIG. 4 is a programming method of a memory provided by an illustrated example of the present application.

FIG. 4 is a method of programming a memory provided by an illustrated example of the present application, the method may be performed by a peripheral circuit of the memory. The method includes at least the following operations.

operation 401, applying precharge voltages to a plurality of word lines.

wherein, before applying a program voltage to a selected word line, a precharge voltage is to be applied to the selected word line first. In some examples, precharge voltages are applied to a selected word line and a deselected word line coupled to other memory cells coupled to the first bit line, and the first bit line refers to a bit line coupled to a memory cell to be programmed coupled to the selected word line, and the selected bit line is also coupled to other unprogrammed memory cells or programmed memory cells. In some examples, precharge voltages are applied to a selected word line and a deselected word line coupled to a programmed memory cell.

In some examples, for a memory string coupled to the first bit line, precharge voltages are applied to a selected word line coupled to a memory cell to be programmed in the memory string and a deselected word line coupled to a programmed memory cell in the memory string.

wherein, the memory cells in the memory string are programmed sequentially along the direction from DSG to SSG; or the memory cells in the memory string are programmed sequentially along the direction from SSG to DSG.

operation 402, sequentially reducing the precharge voltages applied to the plurality of word lines to the first turn-off voltage according to the arrangement order of the memory cells coupled to the plurality of word lines in the memory array.

In some examples, the plurality of word lines include the selected word line coupled to the memory cell to be programmed and the deselected word line coupled to the programmed memory cell.

In some examples, the first turn-off voltage is less than the precharge voltage, and the first turn-off voltage is a preconfigured voltage less than the precharge voltage. In some examples, the first turn-off voltage is 0V, or the first turn-off voltage is a voltage less than a preset voltage threshold, such as: the preset voltage threshold is 0.5V, and the first turn-off voltage is any voltage less than 0.5V.

In some examples, the first turn-off voltages applied to the plurality of word lines are the same or different.

In some examples, when the precharge voltages applied to the plurality of word lines are sequentially reduced to the first turn-off voltage, at least one of the following operations is included:

first, applying the first turn-off voltage to the plurality of word lines one by one according to the arrangement order of the memory cells coupled to the plurality of word lines in the memory array.

In some examples, for the deselected word line coupled to the programmed memory cell in the memory string and the selected word line coupled to the memory cell to be programmed, a first turn-off voltage is applied to the deselected word line and the selected word line one by one according to the arrangement order of the programmed memory cell and the memory cell to be programmed in the memory string.

In some examples, the memory cells in the memory string are sequentially programmed, and the first turn-off voltage is applied to the deselected word line and the selected word line one by one according to the programming order of the memory cells in the memory string.

Figure 5:
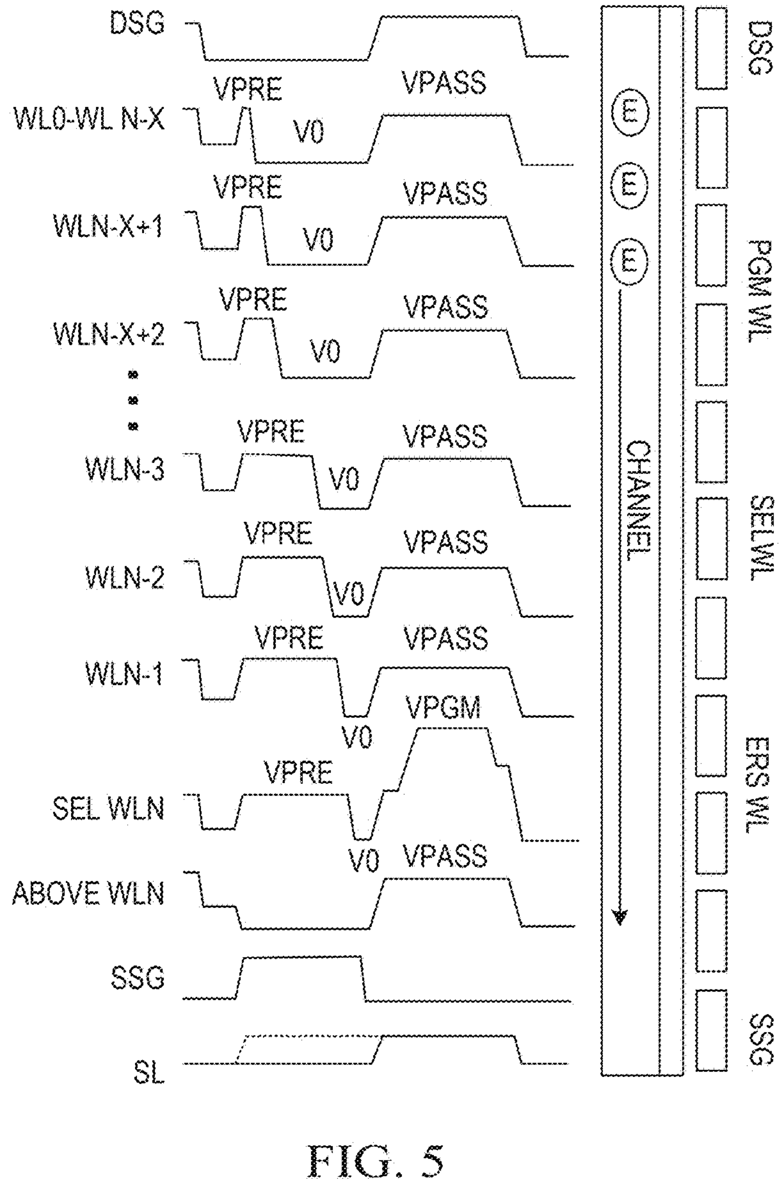
FIG. 5 is a schematic diagram of turning off voltages provided based on the example shown in FIG. 4.

In some examples, the memory cells in the memory string being programmed in the direction from DSG to SSG are taken as an example. As shown in FIG. 5, according to the arrangement order of the memory cells, the precharge voltages Vpre of WL0 to WLn−1 until WLn are sequentially reduced to the first turn-off voltage V0, and the first turn-off voltage V0 can be achieved as 0V. Among them, the precharge voltages of WL0 to WLn are turned off one by one. That is, after the voltage on WL0 is reduced to the first turn-off voltage V0, WL1 is reduced to the first turn-off voltage V0, and the voltages on the word lines are sequentially turned off until WLn−2 is reduced to the first turn-off voltage V0, WLn−1 is reduced to the first turn-off voltage V0, and finally the selected word line WLn is reduced to the first turn-off voltage V0.

After applying the precharge voltages to the deselected word line and the selected word line, as the voltages on WL0 to WLn are sequentially turned off, a potential difference from WL0 to WLn is generated in the channel, thereby driving the electrons in the channel to move in the SSG direction and being extracted from the SSG side, so that the boosting potential of the channel near the selected word line WLn meets the potential requirements, reducing the interference of the selected word line WLn in the L0 programming stage.

Second, applying the first turn-off voltage to the plurality of word lines in groups according to the arrangement order of the memory cells coupled to the plurality of word lines in the memory array.

In some examples, for the deselected word lines coupled to the programmed memory cells in the memory string and the selected word lines coupled to the memory cells to be programmed, the first turn-off voltage is applied to the deselected word lines and the selected word lines in groups according to the arrangement order of the programmed memory cells and the memory cells to be programmed in the memory string.

In some examples, the memory cells in the memory string are sequentially programmed, and the first turn-off voltage is applied to the deselected word lines and the selected word lines in the unit of groups according to the programming order of the memory cells in the memory string.

In some examples, the grouping is for the deselected word lines, and after the voltages on the deselected word lines are reduced to the first turn-off voltage, then the precharge voltage applied to the selected word line is reduced to the first turn-off voltage.

In some examples, the grouping configuration information of the plurality of word lines is obtained, and the grouping configuration information includes a plurality of groups which the plurality of word lines are divided into, wherein at least two word lines in a same group are arranged adjacently in the memory array. The first turn-off voltage is sequentially applied to the word lines in the plurality of groups in the unit of group according to the arrangement order of the memory cells coupled to the plurality of word lines in the memory array.

Among them, the grouping relationship of plurality of word lines is preset, or the number of word lines in the group is preset.

Figure 6:
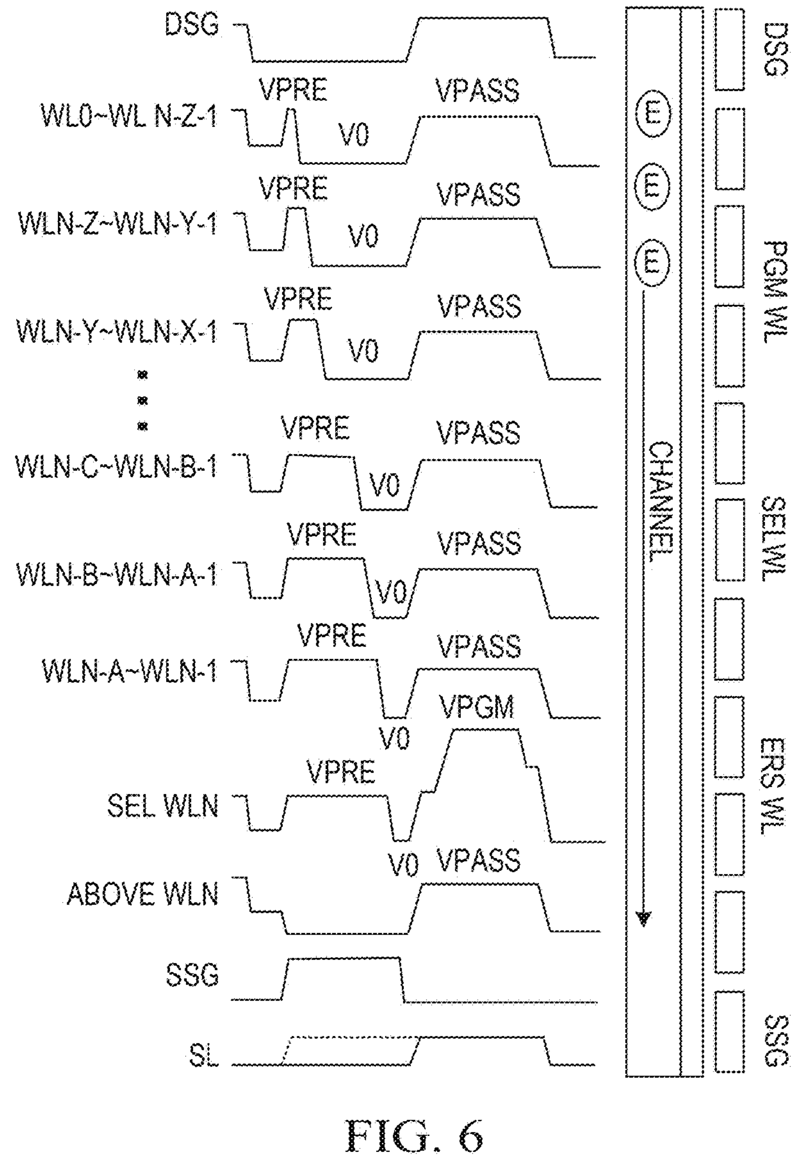
FIG. 6 is a schematic diagram of turning off voltages in groups provided based on the example shown in FIG. 4.

Taking the preset setting of the grouping relationship of plurality of word lines as an example, that is, the memory pre-stores the grouping relationship between plurality of word lines coupled to the memory string, and the memory cells coupled to the word lines in a same group are arranged adjacently in sequence in the memory string. For example: WL0~WLn-z−1 belong to a group, and WLn-z~WLn-y−1 belong to a group. In some examples, the programming of the memory cells in the memory string from DSG to SSG is taken as an example. As shown in FIG. 6, the pre-charge voltages Vpre of WL0 to WLn are sequentially reduced to the first turn-off voltage V0 according to the arrangement order of the memory cells, and the first turn-off voltage V0 can be achieved as 0V. Among them, the turn-off of the pre-charge voltages of WL0 to WLn are sequentially performed in groups. That is, after voltages on WL0~WLn-z−1 are reduced to the first turn-off voltage V0, voltages on WLn-z~WLn-y−1 are reduced to the first turn-off voltage V0, and the voltages of the groups are sequentially turned off until voltages on WLn-a~WLn−1 are reduced to the first turn-off voltage V0, and the selected word line WLn is reduced to the first turn-off voltage V0.

After applying the precharge voltages to the deselected word line and the selected word line, as voltages of the groups from WL0 to WLn are sequentially turned off, a potential difference from WL0 to WLn is generated in the channel, thereby driving the electrons in the channel to move in the SSG direction and being extracted from the SSG side, so that the boosting potential of the channel near the selected word line WLn meets the potential requirements, reducing the interference of the selected word line WLn in the L0 programming stage.

Among them, the voltages of WL0 to WLn are sequentially turned off in groups, so as to avoid a large number of control operations and a large amount of control calculation when turning off WL0 to WLn one by one, thereby improving the turn-off efficiency.

Taking the case where the number of word lines in the group is preset as an example, in some examples, the number of word lines in the group is 3, and the memory cells coupled to the word lines in a same group are arranged adjacently in sequence in the memory string. For example: WL0~WL2 belong to a group, WL3~WL5 belong to a group, and so on, until WLn−1 is divided into a group for being turned off, and finally the selected word line WLn is reduced to the first turn-off voltage.

Third, reducing the precharge voltages applied to a portion of the plurality of word lines to the first turn-off voltage with a preset word line interval according to the arrangement order of the memory cells coupled to the plurality of word lines in the memory array.

Among them, a plurality of target word lines are determined from the plurality of word lines according to the preset interval algorithm, wherein two adjacent target word lines are separated with at least one word line. The precharge voltages applied to the plurality of target word lines are sequentially reduced to the first turn-off voltage according to the arrangement order of the memory cells coupled to the plurality of target word lines in the memory array.

In some examples, the preset interval algorithm is m=2a−1, a is greater than or equal to 1, and m represents the word line number of the target word line, that is, the word line with an odd word line number is selected as the target word line, and WL1, WL3, WL5, . . . , WLn−1 (if n−1 is an odd number) are determined from the plurality of word lines as the target word lines, and the precharge voltages applied to the plurality of target word lines are reduced to the first turn-off voltage according to the arrangement order of the memory cells coupled to the plurality of target word lines in the memory array, and the precharge voltage applied to the selected word line WLn is reduced to the first turn-off voltage. Combined with the above example, the precharge voltages applied to WL1, WL3, WL5, . . . , WLn-1 are sequentially reduced to the first turn-off voltage, and the precharge voltage applied to WLn is reduced to the first turn-off voltage.

After applying the precharge voltages to the deselected word line and the selected word line, as the intervals from WL0 to WLn are sequentially turned off, a potential difference is generated in the channel from WL0 to WLn, thereby driving the electrons in the channel to move in the SSG direction and being extracted from the SSG side, so that the boosting potential of the channel near the selected word line WLn meets the potential requirements, reducing the interference of the selected word line WLn in the L0 programming stage.

Among them, the voltage intervals from WL0 to WLn are sequentially turned off in sequence, avoiding a large number of control operations and a large amount of control calculation when turning off WL0 to WLn one by one, thereby improving the turn-off efficiency.

It is noted that in the above examples, the memory cells in the memory string being programmed from DSG to SSG are taken as an example. In some examples, the memory cells in the memory string can also be programmed from SSG to DSG.

That is, in the example of the present application, the precharge voltages applied to the plurality of word lines are sequentially reduced to the first turn-off voltage along the direction from the drain select gate to the source select gate; or the precharge voltages applied to the plurality of word lines are sequentially reduced to the first turn-off voltage along the direction from the source select gate to the drain select gate.

Wherein, when the precharge voltages applied to the plurality of word lines are sequentially reduced to the first turn-off voltage along the direction from the drain select gate to the source select gate, the voltage at the source line terminal is turned on, that is, the preset voltage is applied to the source line SL or not, so that the electrons in the channel are discharged from the source line terminal; when the precharge voltages applied to the plurality of word lines are sequentially reduced to the first turn-off voltage along the direction from the source select gate to the drain select gate, the voltage at the bit line terminal is turned on, that is, the preset voltage is applied to the bit line BL or not, so that the electrons in the channel are discharged from the bit line terminal.

Figure 7:
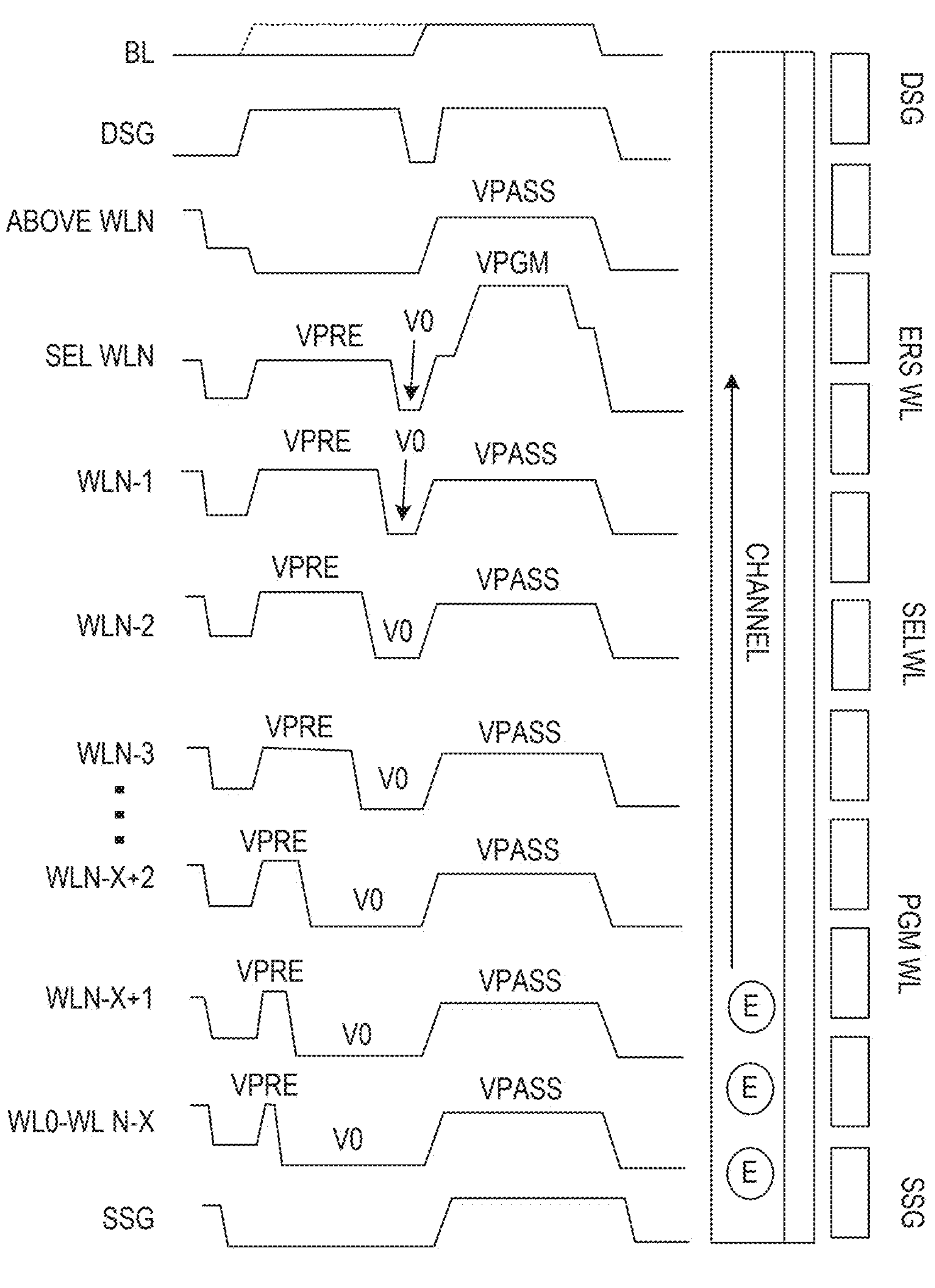
FIG. 7 is a schematic diagram of turning off voltages provided based on the example shown in FIG. 4.

The example of programming the memory cells in the memory string from SSG to DSG, and applying the first turn-off voltage to the plurality of word lines one by one according to the arrangement order of the memory cells coupled to the plurality of word lines in the memory array is explained. In some examples, please refer to FIG. 7. According to the arrangement order of the memory cells, the precharge voltages Vpre of WL0 to WLn−1 and WLn are sequentially reduced to the first turn-off voltage V0, and the first turn-off voltage V0 can be achieved as 0V. Among them, the precharge voltages of WL0 to WLn are turned off one by one. That is, after WL0 is reduced to the first turn-off voltage V0, WL1 is reduced to the first turn-off voltage V0, and the voltages on the word lines are sequentially turned off until WLn−2 is reduced to the first turn-off voltage V0, WLn−1 is reduced to the first turn-off voltage V0, and finally the selected word line WLn is reduced to the first turn-off voltage V0.

In some examples, in order to avoid the situation that when the precharge voltage is large, the voltages on the word lines are sequentially reduced to the first off voltage, which will generate a large voltage difference and thus generate hot carrier injection (HCI), the precharge voltage can be first reduced to the first intermediate voltage, and then reduced from the first intermediate voltage to the first off voltage.

Operation 403, applying a program voltage to a selected word line in the plurality of word lines, and applying a turn-on voltage to other word lines in the plurality of word lines.

After applying the first off voltage to the plurality of word lines, applying a program voltage to the selected word line to complete the L0 programming of the memory cell coupled to the selected word line.

In some examples, after applying the first off voltage to the plurality of word lines, applying a turn-on voltage to the deselected word line coupled to the programmed memory cell among the plurality of word lines.

In summary, the method provided in this example, when programming the selected word line, after applying the precharge voltage in the precharge stage, the precharge voltage applied to the word line is sequentially reduced to a preset turn-off voltage according to the arrangement order of plurality of word lines. Since the precharge voltages on the word lines are sequentially turned off, when the first word line is turned off, the second word line adjacent to the first word line has not been turned off, thereby generating a potential difference from the first word line to the second word line in the channel, driving the electrons in the channel to move from the direction of the first word line to the direction of the second word line, and as the voltages on the plurality of word lines are sequentially turned off, the electrons in the channel are driven to move from the channel to one end and are drawn away, avoiding the electrons in the channel from affecting the voltage difference between the word line and the channel, thereby affecting the programming effect of the erased state L0 after the precharge stage, and reducing the programming interference of L0.

Figure 8:
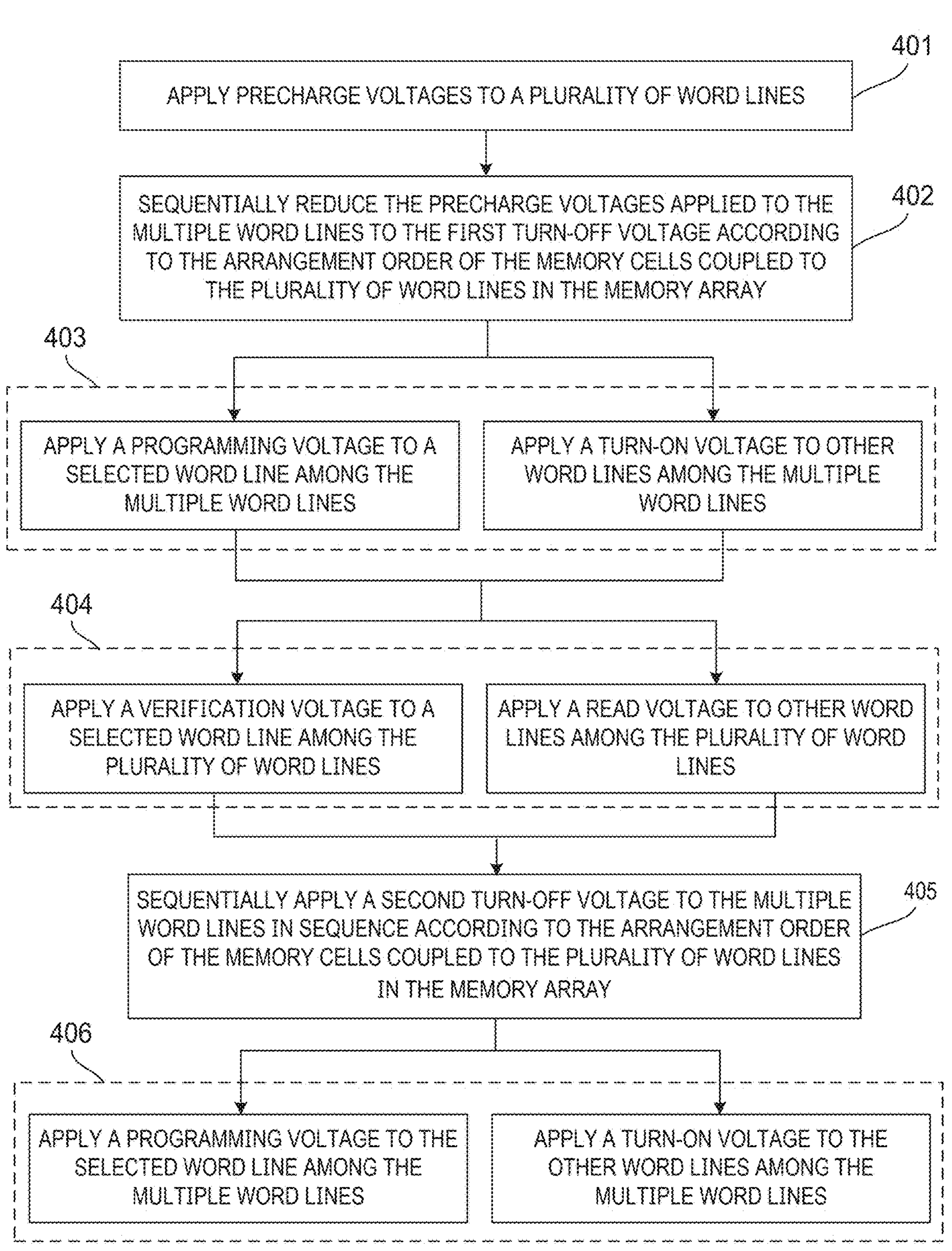
FIG. 8 is a programming method of a memory provided by another illustrated example of the present application.

In some examples, the above-mentioned turn-off voltage is applied to the precharge voltage stage and the verification voltage stage. FIG. 8 is a method of programming a memory provided by another illustrated example of the present application, which may be performed by a peripheral circuit of the memory. After the above operation 403, the method includes at least the following operations.

Operation 404, applying a verification voltage to a selected word line in the plurality of word lines, and applying a read voltage to other word lines in the plurality of word lines.

That is, after applying the program voltage to the selected word line, it is required to verify the programming result of the memory cell coupled to the selected word line, that is, to verify whether the memory cell coupled to the selected word line meets the program voltage requirement. Therefore, a verification voltage is applied to the selected word line coupled to the memory cell to be programmed among the plurality of word lines, and a read voltage is applied to the deselected word line coupled to the programmed memory cell among the plurality of word lines.

Operation 405, a second turn-off voltage is sequentially applied to the plurality of word lines according to the arrangement order of the memory cells coupled to the plurality of word lines in the memory array.

In some examples, the second turn-off voltage is less than the verification voltage, or the second turn-off voltage is less than the read voltage, and the second turn-off voltage is a pre-configured voltage less than the verification voltage and the read voltage. In some examples, the second turn-off voltage is 0V, or the second turn-off voltage is a voltage less than a preset voltage threshold, such as: the preset voltage threshold is 0.5V, and the second turn-off voltage is any voltage less than 0.5V.

In some examples, the second turn-off voltages applied to a plurality of word lines are the same or different.

In some examples, when the verification voltages/read voltages applied to a plurality of word lines are sequentially reduced to the second turn-off voltage, at least one of the following ways is included:

First, the second turn-off voltage is applied to a plurality of word lines one by one according to the arrangement order of the memory cells coupled to the plurality of word lines in the memory array.

In some examples, for the deselected word lines coupled to the programmed memory cells and the unprogrammed memory cells in the memory string and the selected word lines coupled to the memory cells to be programmed, the second turn-off voltage is applied to the deselected word lines and the selected word lines one by one according to the arrangement order of the memory cells in the memory string.

In some examples, the memory cells in the memory string are sequentially programmed, and the second turn-off voltage is applied to the deselected word lines and the selected word lines one by one according to the programming order of the memory cells in the memory string.

Figures 9, 10:
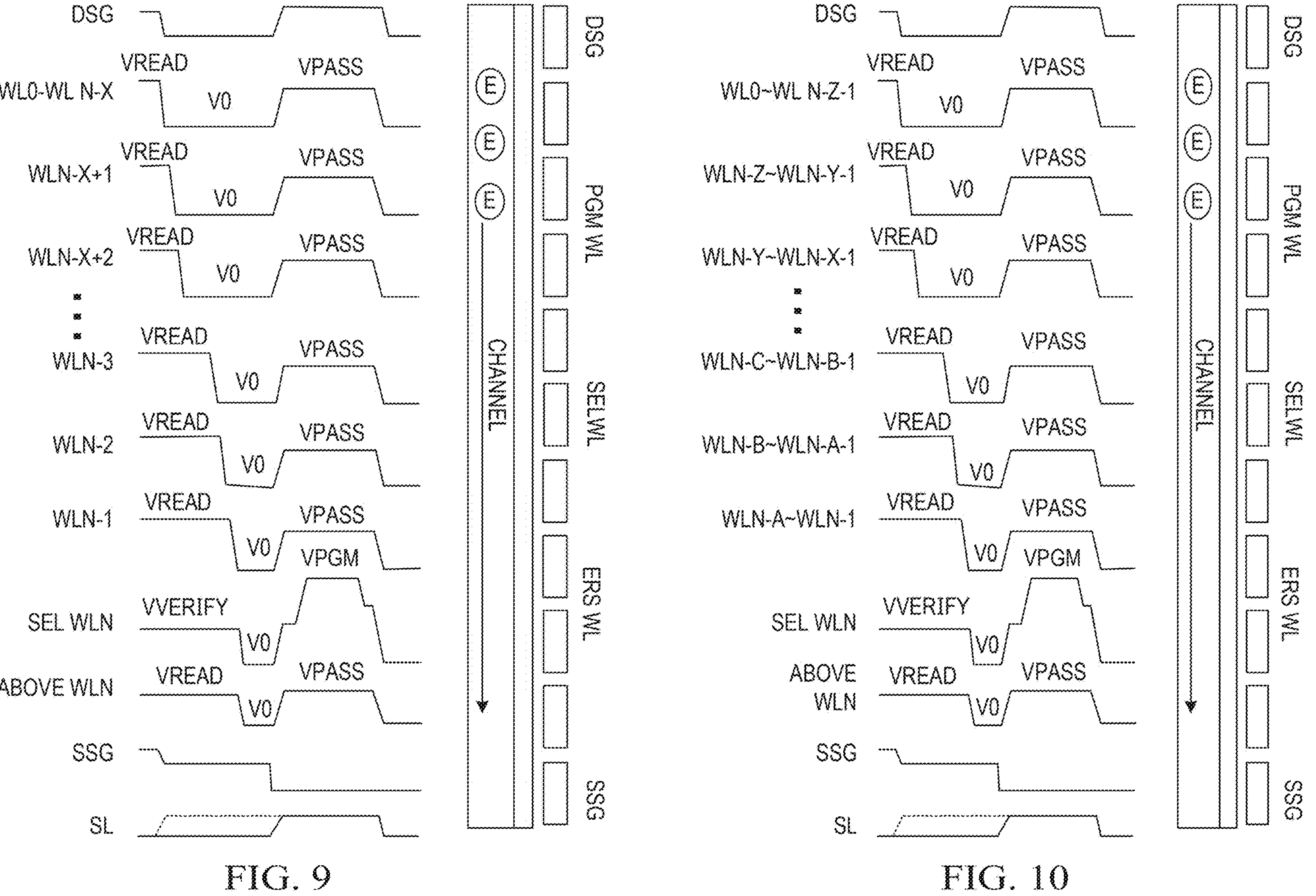
FIG. 9 is a schematic diagram of turning off voltages provided based on the example shown in FIG. 8.
FIG. 10 is a schematic diagram of turning off voltages in groups provided based on the example shown in FIG. 8.

In some examples, the memory cell in the memory string is programmed from DSG to SSG as an example. As shown in FIG. 9, according to the arrangement order of the memory cells, the verification voltages Vverify or the read voltages Vread of WL0 to WLn−1 until WLn are sequentially reduced to the second turn-off voltage V0, and the second turn-off voltage V0 can be achieved as 0V. Among them, the verification voltages or the read voltages of WL0 to WLn are turned off one by one. That is, after WL0 is reduced to the second turn-off voltage V0, WL1 is reduced to the second turn-off voltage V0, and the voltages on the word lines are sequentially turned off until WLn−2 is reduced to the second turn-off voltage V0, WLn−1 is reduced to the second turn-off voltage V0, and the selected word line WLn is reduced to the second turn-off voltage V0.

After applying verification voltages or read voltages to the deselected word line and the selected word line, as the voltages on WL0 to WLn are sequentially turned off, a potential difference is generated in the channel from WL0 to WLn, thereby driving the electrons in the channel to move in the SSG direction and being extracted from the SSG side, so that the boosting potential of the channel near the selected word line WLn meets the potential requirements, reducing the interference of the selected word line WLn in the programming stage of the program state.

Second, the second turn-off voltage is applied to the plurality of word lines in groups according to the arrangement order of the memory cells coupled to the plurality of word lines in the memory array.

In some examples, for the deselected word line coupled to the programmed memory cell in the memory string and the selected word line coupled to the memory cell to be programmed, according to the arrangement order of the programmed memory cell and the memory cell to be programmed in the memory string, the second turn-off voltage is sequentially applied to the deselected word line and the selected word line in groups.

In some examples, the memory cells in the memory string are sequentially programmed, and the second turn-off voltage is sequentially applied to the deselected word line and the selected word line in groups according to the programming sequence of the memory cells in the memory string.

In some examples, the grouping is for the deselected word line, and after the deselected word line is reduced to the second turn-off voltage, the verification voltage applied to the selected word line is reduced to the second turn-off voltage.

In some examples, the grouping configuration information of the plurality of word lines is obtained, and the grouping configuration information includes a plurality of groups obtained by dividing the plurality of word lines, wherein at least two word lines in a same group are arranged adjacently in the memory array. The second turn-off voltage is sequentially applied to the word lines in the plurality of groups in the unit of group according to the arrangement sequence of the memory cells coupled to the plurality of word lines in the memory array.

Wherein, the grouping relationship of the plurality of word lines is preset, or the number of word lines in the group is preset.

Taking the preset setting of the grouping relationship of the plurality of word lines as an example, that is, the grouping relationship between the plurality of word lines coupled to the memory string is pre-stored in the memory, and the memory cells coupled to the word lines in a same group are arranged adjacently in sequence in the memory string. For example: WL0~WLn-z−1 is a group, and WLn-z~WLn-y−1 is a group. In some examples, the memory cells in the memory string being programmed from DSG to SSG are taken as an example. As shown in FIG. 10, according to the arrangement order of the memory cells, the verification voltages Vverify or the read voltages Vread of WL0 to WLn are sequentially reduced to the second turn-off voltage V0, and the second turn-off voltage V0 can be achieved as 0V. Among them, the turn-off of WL0 to WLn is performed sequentially in groups. That is, after the voltages on WL0~WLn-z−1 are reduced to the second turn-off voltage V0, the voltages on WLn-z~WLn-y−1 are reduced to the second turn-off voltage V0, and the voltages on the groups are sequentially turned off until the voltages on WLn-a~WLn−1 are reduced to the second turn-off voltage V0, and the voltage on the selected word line WLn is reduced to the second turn-off voltage V0.

After applying verification voltage or read voltage to the deselected word line and the selected word line, as the voltages of the groups of WL0 to WLn are sequentially turned off, a potential difference is generated in the channel from WL0 to WLn, thereby driving the electrons in the channel to move in the SSG direction and being extracted from the SSG side, so that the boosting potential of the channel near the selected word line WLn meets the potential requirements, reducing the interference of the selected word line WLn in the L0 programming stage.

Among them, the voltages of WL0 to WLn are sequentially turned off in the unit of group, avoiding a large number of control operations and a large amount of control calculation when turning off WL0 to WLn one by one, thereby improving the turn-off efficiency.

Taking the case where the number of word lines in a group is pre-set as an example, in some examples, the number of word lines in a group is 3, and the memory cells coupled to the word lines in a same group are arranged adjacently in sequence in the memory string. For example: WL0~WL2 is a group, WL3~WL5 is a group, and so on, until WLn−1 is divided into a group for turn-off, and finally the voltage on the selected word line WLn is reduced to the second turn-off voltage.

Third, the verification voltages or read voltages applied to a portion of the plurality of word lines are reduced to the second turn-off voltage with a preset word line interval according to the arrangement order of the memory cells coupled to the plurality of word lines in the memory array.

Among them, a plurality of target word lines are determined from the plurality of word lines according to the preset interval algorithm, wherein two adjacent target word lines are separated with at least one word line. the verification voltages or read voltages sequentially applied to the plurality of target word lines are reduced to the second turn-off voltage according to the arrangement order of the memory cells coupled to the plurality of target word lines in the memory array.

It is noted that in the above example, the memory cells in the memory string being programmed from DSG to SSG are taken as an example. In some examples, the memory cells in the memory string can also be programmed from SSG to DSG.

That is, in the example of the present application, the verification voltages or read voltages applied to the plurality of word lines are sequentially reduced to the second turn-off voltage along the direction from the drain select gate to the source select gate; or the verification voltages or read voltages applied to the plurality of word lines are sequentially reduced to the second turn-off voltage along the direction from the source select gate to the drain select gate.

The memory cells in the memory string are programmed from the SSG to the DSG direction, and the second turn-off voltage is applied to the plurality of word lines one by one according to the arrangement order of the memory cells coupled to the plurality of word lines in the memory array.

Operation 406, applying a program voltage to the selected word line in the plurality of word lines, and applying a turn-on voltage to the other word lines in the plurality of word lines.

In summary, the method provided in this example, when programming the selected word line, after applying the verification voltage or the read voltage in the programming verification stage, the voltages applied to the word lines are sequentially reduced to a preset second turn-off voltage according to the arrangement order of the plurality of word lines. Since the voltages are sequentially turned off, when the first word line is turned off, the second word line adjacent to the first word line has not yet been turned off, thereby generating a potential difference from the first word line to the second word line in the channel, driving the electrons in the channel to move from the direction of the first word line to the direction of the second word line, and as the voltages on the plurality of word lines are sequentially turned off, the electrons in the channel are driven to move from the channel to one end and are extracted, thereby avoiding the electrons in the channel affecting the voltage difference between the word lines, thereby affecting the programming effect of other word line program states after the programming stage, and reducing programming interference.

Figure 11:
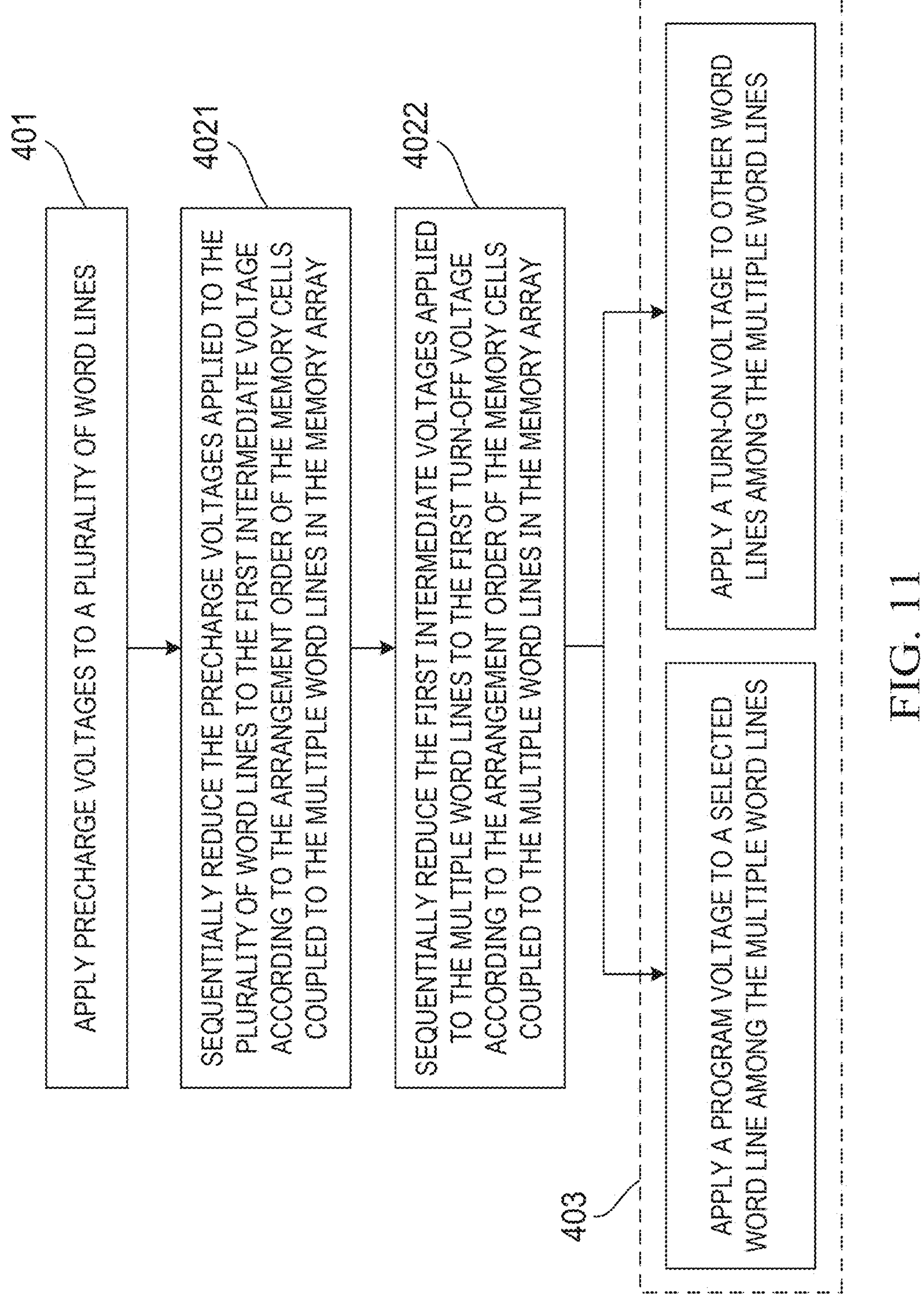
FIG. 11 is a programming method of a memory provided by another illustrated example of the present application.

In some examples, when the precharge voltage is large, when the voltage applied to the first word line is reduced to the first turn-off voltage, the voltage difference between the first word line and the adjacent second word line will be large, thereby generating an HCI effect. In an example of the present application, by setting a first intermediate voltage, when the precharge voltage is turned off, the precharge voltage is first reduced to the first intermediate voltage, and then reduced from the first intermediate voltage to the first turn-off voltage. FIG. 11 is a method of programming a memory provided by another illustrated example of the present application, which can be performed by a peripheral circuit of the memory. The above operation 402 can also be implemented to include the following operations.

Operation 4021, the precharge voltages applied to the plurality of word lines are sequentially reduced to the first intermediate voltage according to the arrangement order of the memory cells coupled to the plurality of word lines in the memory array.

The first intermediate voltage is a voltage between the precharge voltage and the first turn-off voltage. In some examples, the first intermediate voltage is a pre-set voltage.

In some examples, the first intermediate voltages applied to the plurality of word lines are the same or different.

In some examples, when the precharge voltages applied to the plurality of word lines are sequentially reduced to the first intermediate voltage, at least one of the following ways is included:

First, the first intermediate voltage is applied to the plurality of word lines one by one according to the arrangement order of the memory cells coupled to the plurality of word lines in the memory array.

In some examples, for the deselected word lines coupled to the programmed memory cells in the memory string and the selected word lines coupled to the memory cells to be programmed, the first intermediate voltage is applied to the deselected word lines and the selected word lines one by one according to the arrangement order of the programmed memory cells and the memory cells to be programmed in the memory string.

In some examples, the memory cells in the memory string are sequentially programmed, and the first intermediate voltage is applied to the deselected word lines and the selected word lines one by one according to the programming order of the memory cells in the memory string.

Figure 12:
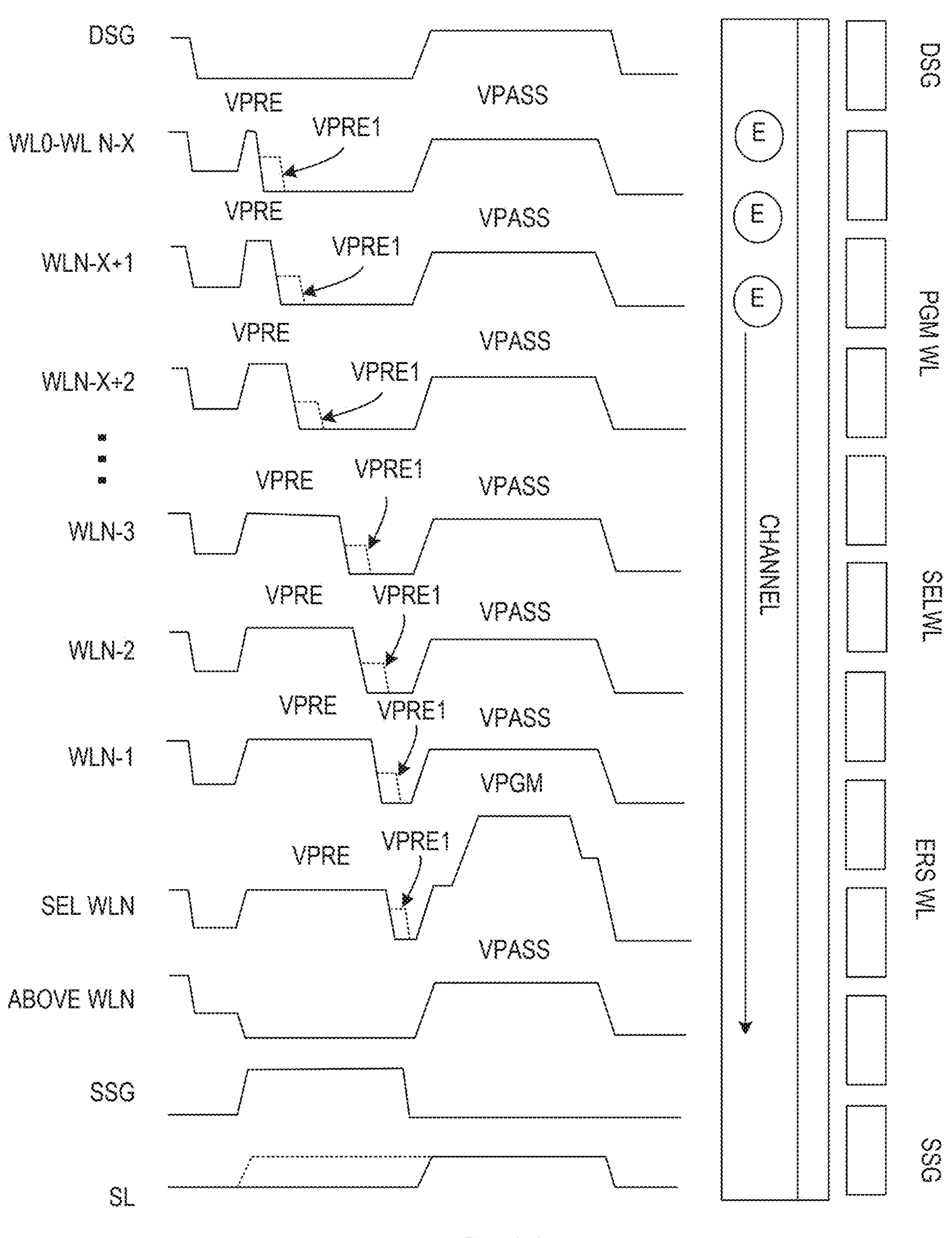
FIG. 12 is a schematic diagram of turning off voltages through an intermediate voltage provided based on the example shown in FIG. 11.

In some examples, the memory cells in the memory string being programmed from DSG to SSG is taken as an example. As shown in FIG. 12, the precharge voltages Vpre of WL0 to WLn−1 until WLn are sequentially reduced to the first intermediate voltage Vpre1 according to the arrangement order of the memory cells. Among them, after the voltage on WL0 is reduced to the first intermediate voltage Vpre1, the voltage on WL1 is reduced to the first intermediate voltage Vpre1, and the voltages on the word lines are sequentially turned off, until the voltage on WLn−2 is reduced to the first intermediate voltage Vpre1, the voltage on WLn−1 is reduced to the first intermediate voltage Vpre1, and finally the voltage on the selected word line WLn is reduced to the first intermediate voltage Vpre1.

After applying the precharge voltages to the deselected word line and the selected word line, as the voltages on WL0 to WLn are sequentially reduced to the first intermediate voltage Vpre1, and then reduced from the first intermediate voltage Vpre1 to the first turn-off voltage, it can not only generate a potential difference from WL0 to WLn in the channel, thereby driving the electrons in the channel to move in the SSG direction, but also avoid the voltage difference being too large due to the direct reduction from the precharge voltage to the first turn-off voltage, resulting in the HCI effect.

Second, the first intermediate voltage is applied to the plurality of word lines in groups according to the arrangement order of the memory cells coupled to the plurality of word lines in the memory array.

In some examples, for the deselected word lines coupled to the programmed memory cells and the selected word lines coupled to the memory cells to be programmed in the memory string, the first intermediate voltage is applied to the deselected word lines and the selected word lines in groups according to the arrangement order of the programmed memory cells and the memory cells to be programmed in the memory string.

In some examples, the memory cells in the memory string are sequentially programmed, and the first intermediate voltage is applied to the deselected word lines and the selected word lines in the unit of group according to the programming order of the memory cells in the memory string.

In some examples, the grouping is for the deselected word lines, and after the voltages on the deselected word lines are reduced to the first intermediate voltage, the precharge voltages applied to the selected word lines are reduced to the first intermediate voltage.

In some examples, the grouping configuration information of the plurality of word lines is obtained, and the grouping configuration information includes a plurality of groups obtained by dividing the plurality of word lines, wherein at least two word lines in a same group are arranged adjacently in the memory array. The first intermediate voltage is applied to the word lines in the plurality of groups in the unit of group according to the arrangement order of the memory cells coupled to the plurality of word lines in the memory array.

Wherein, the grouping relationship of the plurality of word lines is preset, or the number of word lines in the group is preset.

Third, the precharge voltages applied to a portion of the plurality of word lines are reduced to the first intermediate voltage with a preset word line interval according to the arrangement order of the memory cells coupled to the plurality of word lines in the memory array.

Wherein, a plurality of target word lines are determined from the plurality of word lines according to a preset interval algorithm, wherein two adjacent target word lines are separated with at least one word line. The precharge voltages applied to the plurality of target word lines are sequentially reduced to the first intermediate voltage according to the arrangement order of the memory cells coupled to the plurality of target word lines in the memory array.

In some examples, the preset interval algorithm is m=2a−1, a is greater than or equal to 1, and m represents the word line number of the target word line, that is, the word line with an odd word line number is selected as the target word line, and WL1, WL3, WL5, . . . , WLn−1 (if n−1 is an odd number) are determined from plurality of word lines as the target word lines, and the precharge voltages applied to the plurality of target word lines are reduced to the first intermediate voltage according to the arrangement order of the memory cells coupled to the plurality of target word lines in the memory array, and the precharge voltage applied to the selected word line WLn is reduced to the first intermediate voltage. Combined with the above example, the precharge voltages applied to WL1, WL3, WL5, . . . , WLn−1 are sequentially reduced to the first intermediate voltage, and the precharge voltage applied to WLn is reduced to the first intermediate voltage.

It is noted that in the above example, the memory cells in the memory string being programmed from DSG to SSG is taken as an example. In some examples, the memory cells in the memory string can also be programmed from SSG to DSG.

That is, in the example of the present application, the precharge voltages applied to the plurality of word lines are sequentially reduced to the first intermediate voltage along the direction from the drain selection gate to the source selection gate; or the precharge voltages applied to the plurality of word lines are sequentially reduced to the first intermediate voltage along the direction from the source selection gate to the drain selection gate.

Operation 4022, the first intermediate voltage applied to the plurality of word lines are sequentially reduced to the first turn-off voltage according to the arrangement order of the memory cells coupled to the plurality of word lines in the memory array.

In some examples, after a preset time interval after applying the first intermediate voltage to the word line, the first intermediate voltage applied to the word line is reduced to the first turn-off voltage, thereby producing the effect that the first intermediate voltages applied to the plurality of word lines are sequentially reduced to the first turn-off voltage.

In other examples, the way of reducing the precharge voltages applied to the plurality of word lines to the first intermediate voltage is the same as or different from the way of reducing the first intermediate voltages applied to the plurality of word lines to the first turn-off voltage.

In some examples, the way of reducing the precharge voltage applied to a plurality of word lines to the first intermediate voltage and then to the first turn-off voltage includes at least one of the following operations:

1. applying the first intermediate voltage to the plurality of word lines one by one according to the arrangement order of the memory cells coupled to the plurality of word lines in the memory array, and applying the first turn-off voltage to the plurality of word lines one by one according to the arrangement order of the memory cells coupled to the plurality of word lines in the memory array;
2. applying the first intermediate voltage to the plurality of word lines one by one according to the arrangement order of the memory cells coupled to the plurality of word lines in the memory array; after the plurality of word lines in a same group is reached at the first intermediate voltage, applying the first turn-off voltage to the plurality of word lines in the unit of group, according to the arrangement order of the memory cells coupled to the plurality of word lines in the memory array;
3. applying a first intermediate voltage to the plurality of word lines in the unit of group according to the arrangement order of the memory cells coupled to the plurality of word lines in the memory array; applying the first turn-off voltage to the plurality of word lines one by one from the first intermediate voltage according to the arrangement order of the memory cells coupled to the plurality of word lines in the memory array;
4. applying the first intermediate voltage to the plurality of word lines in groups according to the arrangement order of the memory cells coupled to the plurality of word lines in the memory array; applying the first turn-off voltage to the plurality of word lines in the unit of group according to the arrangement order of the memory cells coupled to the plurality of word lines in the memory array;
5. reducing the precharge voltages applied to a portion of the plurality of word lines to the first intermediate voltage with a preset word line interval according to the arrangement order of the memory cells coupled to the plurality of word lines in the memory array; reducing the first intermediate voltage applied to the word lines reduced to the first intermediate voltage in the plurality of word lines to the first turn-off voltage with a preset word line interval according to the arrangement order of the memory cells coupled to the plurality of word lines in the memory array.

It is noted that the above-mentioned way of reducing the precharge voltages applied to the plurality of word lines to the first intermediate voltage and then to the first turn-off voltage is only an illustrative example, and the examples of the present application are not limited to this.

In summary, the method provided in this example, when programming the selected word line, after applying the verification voltage or the read voltage in the programming verification stage, the voltage applied on the word line is sequentially reduced to the preset second turn-off voltage according to the arrangement order of the plurality of word lines. Since the voltages are sequentially turned off, when the first word line is turned off, the second word line adjacent to the first word line has not been turned off, so that a potential difference from the first word line to the second word line is generated in the channel, driving the electrons in the channel to move from the direction of the first word line to the direction of the second word line, and as the voltages on the plurality of word lines are sequentially turned off, the electrons in the channel are driven to move from the channel to one end and are drawn away, avoiding the electrons in the channel from affecting the voltage difference between the word lines, thereby affecting the programming effect of the program state of other word lines after the programming stage, and reducing programming interference.

Figure 13:
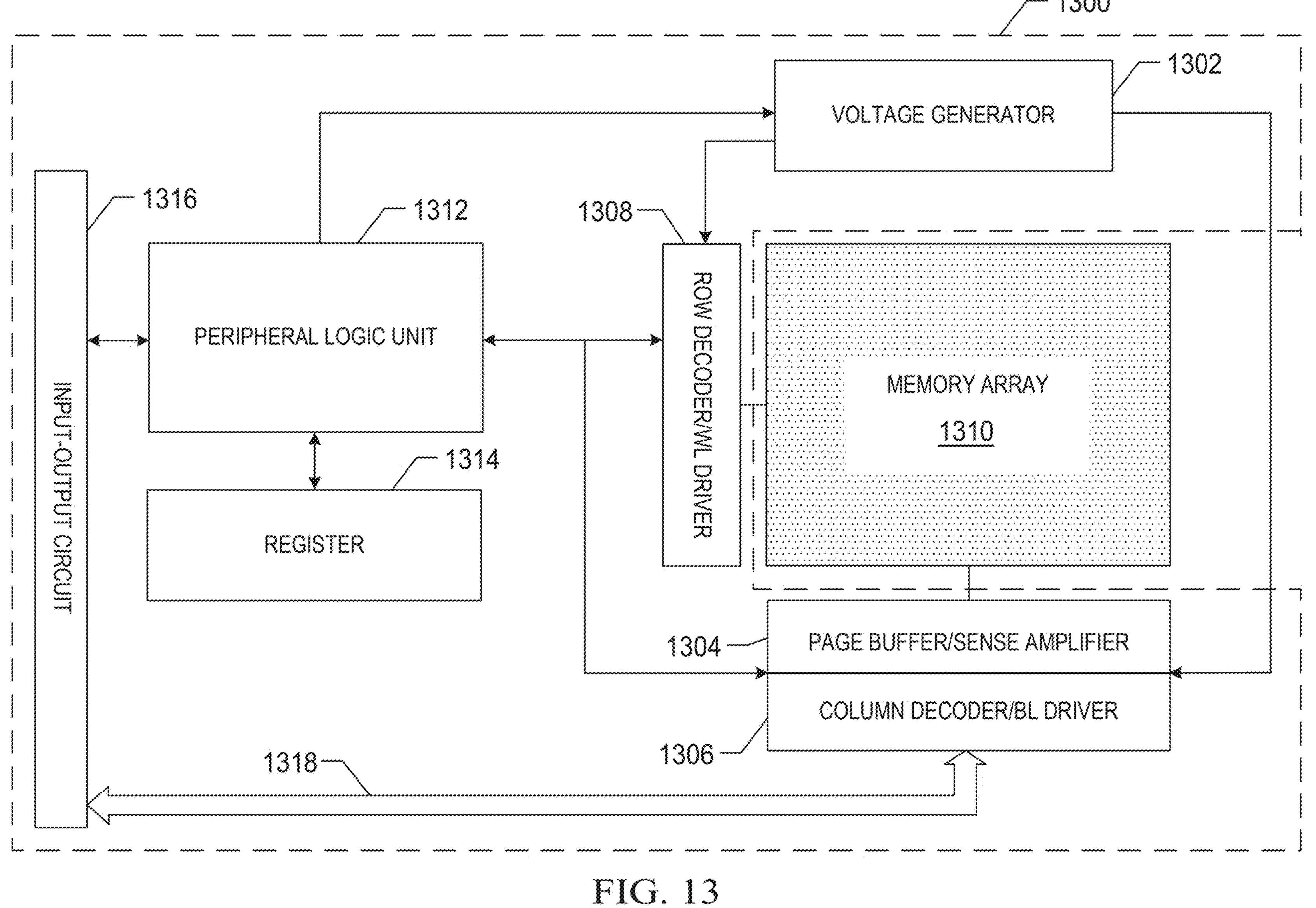
FIG. 13 is a schematic diagram of the structure of a memory provided by an illustrated example of the present application.

FIG. 13 is a structural schematic diagram of a memory provided by an example of the present application. As shown in FIG. 13, the memory includes a peripheral circuit 1300 and a memory array 1310.

The peripheral circuit 1300 is to write data to the memory array 1310 and read data from the memory array 1310.

The peripheral circuit 1300 includes: a voltage generator 1302, a page buffer/sense amplifier 1304, a column decoder/bit line (BL) driver 1306, a row decoder/word line (WL) driver 1308, a peripheral logic unit 1312, a register 1314, an input-output circuit 1316, and a data bus 1318. It should be understood that in some examples, additional peripheral circuits not shown in FIG. 13 may also be included.

The page buffer/sense amplifier 1304 may be configured to read data from the memory array 1310 and program (write) data to the memory array 1310 according to a control signal from the peripheral logic unit 1312. In one example, the page buffer/sense amplifier 1304 may store a page of programming data (write data) to be programmed into one page of the memory array 1310. In another example, the page buffer/sense amplifier 1304 can perform a program verification operation to ensure that the data has been correctly programmed into the memory cell coupled to the selected word line. In yet another example, the page buffer/sense amplifier 1304 can also sense a low-power signal from a bit line representing a data bit stored in the memory cell and amplify a small voltage swing to a recognizable logic level in a read operation.

The column decoder/bit line driver 1306 can be configured to be controlled by the peripheral logic unit 1312 and select one or more NAND memory strings by applying a bit line voltage generated from the voltage generator 1302.

The row decoder/word line driver 1308 can be configured to be controlled by the peripheral logic unit 1312 and select/deselect a block of the memory array 1310 and select/deselect a word line of the block. The row decoder/word line driver 1308 can also be configured to drive the word line using a word line voltage (VWL) generated from the voltage generator 1302. In some examples, the row decoder/word line driver 1308 can also select/deselect and drive the source selection gate line and the drain selection gate line. In some examples, the row decoder/word line driver 1308 is configured to perform an erase operation on the memory cell coupled to the (one or more) selected word lines.

The voltage generator 1302 can be configured to be controlled by the peripheral logic unit 1312 and generate word line voltages (e.g., read voltages, program voltages, pass voltages, local voltages, verification voltages, etc.), bit line voltages, and source line voltages to be supplied to the memory array 1310.

The peripheral logic unit 1312 can be coupled to each peripheral circuit described above and is configured to control the operation of each peripheral circuit. The peripheral logic unit 1312 includes a control circuit as shown in FIG. 13 above.

The register 1314 can be coupled to the peripheral logic unit 1312 and includes a status register, a command register, and an address register for storing status information, a command operation code (OP code), and a command address for controlling the operation of each peripheral circuit. The input-output circuit 1316 can be coupled to the peripheral logic unit 1312 and act as a control buffer to buffer control commands received from a host (not shown) and relay them to the peripheral logic unit 1312, and buffer status information received from the peripheral logic unit 1312 and relay it to the host. The input-output circuit 1316 can also be coupled to the column decoder/bit line driver 1306 via the data bus 1318, and act as a data input-output interface and data buffer to buffer data and relay it to the memory array 1310 or relay or buffer data from the memory array 1310.

It should be emphasized that the peripheral circuit 1300 is configured to perform the memory programming method provided by the example of the present disclosure on a selected memory cell row among a plurality of memory cell rows.

Figure 14:
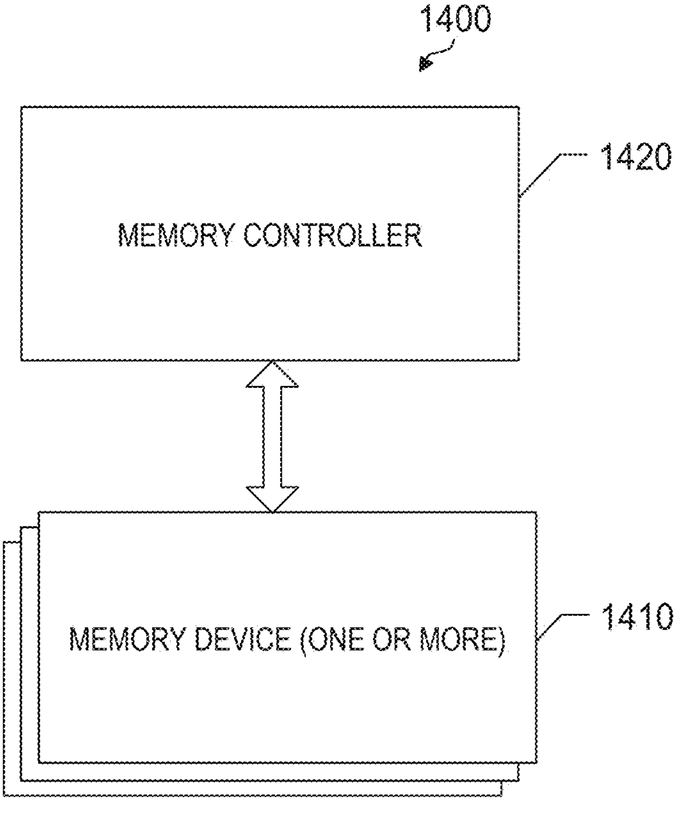
FIG. 14 is a schematic diagram of the structure of a memory system provided by an illustrated example of the present application.

FIG. 14 is a block diagram of a memory system provided by an illustrated example of the present application. As shown in FIG. 14, the memory system 1400 includes: one or more memories 1410, and a memory controller 1420 coupled to the memory 1410 and configured to control the memory 1410.

The memory system 1400 may be a mobile phone, a desktop computer, a laptop computer, a tablet computer, a vehicle computer, a game console, a printer, a positioning device, a wearable electronic device, a smart sensor, a virtual reality (VR) device, an augmented reality (AR) device, or any other suitable electronic device having a memory device therein.

In some examples, the memory system 1400 may include a host and a memory subsystem, the memory subsystem having one or more memories 1410 and a memory controller 1420. The host may be a processor (e.g., a central processing unit (CPU)) or a system on chip (SoC) (e.g., an application processor (AP)) of an electronic device. The host may be configured to send data to the memory 1410. Alternatively, the host may be configured to receive data from the memory 1410.

According to some examples, the memory controller 1420 is also coupled to the host. The memory controller 1420 may manage data stored in the memory 1410 and communicate with the host.

In some examples, the memory controller 1420 is designed to operate in a low duty cycle environment, such as a Secure Digital (SD) card, a Compact Flash (CF) card, a Universal Serial Bus (USB) flash drive, or other media for use in electronic devices such as personal computers, digital cameras, mobile phones, etc.

In some examples, the memory controller 1420 is designed to operate in a high duty cycle environment Solid State Disk (SSD) or an embedded Multi Media Card (eMMC), which is used as a data memory for mobile devices such as smart phones, tablet computers, laptop computers, etc. and enterprise memory arrays.

The memory controller 1420 may be configured to control operations of the memory 1410, such as read, erase, and program operations. The memory controller 1420 may also be configured to manage various functions regarding data stored or to be stored in the memory 1410, including but not limited to bad block management, garbage collection, logical to physical address conversion, wear leveling, etc. In some examples, the memory controller 1420 is also configured to process error correction codes (ECC) regarding data read from or written to the memory 1410.

The memory controller 1420 may also perform any other suitable functions, such as formatting the memory 1410. The memory controller 1420 may communicate with an external device according to a specific communication protocol.

The memory controller 1420 and one or more memories 1410 may be integrated into various types of memory devices, for example, included in the same package (e.g., Universal Flash Storage (UFS) package or eMMC package). That is, the memory system 1400 may be implemented and packaged into different types of terminal electronic products.

In some examples, the memory controller 1420 and a single memory 1410 may be integrated into a memory card. The memory card may include a PC card (PCMCIA, Personal Computer Memory Card International Association), a CF card, a Smart Media (SM) card, a memory stick, a multimedia card, an SD card, a UFS, etc. The memory card may also include a memory card connector that couples the memory card to the host.

In some examples, the memory controller 1420 and the plurality of memories 1410 may be integrated into a solid-state drive (SSD). In some examples, the memory capacity and/or operating speed of the solid-state drive is greater than the memory capacity and/or operating speed of the memory card.

It is understood that the memory controller 1420 may execute a memory programming method as provided in any example of the present disclosure.

The present application example provides a control circuit, the control circuit including a programmable logic circuit and/or a program instruction, and the control circuit may be used to implement the memory programming method provided in the aforementioned example of the present application. The programming operation includes a first programming stage and a second programming stage.

In some examples, as shown in FIG. 13, the memory includes a peripheral circuit 1300 and a memory array 1310, wherein the memory array includes a plurality of memory cells coupled to a first bit line and to a plurality of word lines respectively, wherein the plurality of word lines include a selected word line coupled to a memory cell to be programmed;

The peripheral circuit 1300 is configured to apply precharge voltages to the plurality of word lines;

sequentially reduce the precharge voltages applied to the plurality of word lines to a first off voltage according to the arrangement order of the memory cells coupled to the plurality of word lines in the memory array;

apply a program voltage to the selected word line in the plurality of word lines, and apply a turn-on voltage to the other word lines in the plurality of word lines.

In some examples, the peripheral circuit 1300 is further configured to:

apply the first turn-off voltage to the plurality of word lines one by one according to the arrangement order of the memory cells coupled to the plurality of word lines in the memory array; or apply the first turn-off voltage to the plurality of word lines in groups according to the arrangement order of the memory cells coupled to the plurality of word lines in the memory array.

In some examples, the peripheral circuit 1300 is further configured to:

obtain group configuration information of the plurality of word lines, the group configuration information includes a plurality of groups which the plurality of word lines are divided into, wherein at least two word lines in a same group are arranged adjacently in the memory array;

sequentially apply the first turn-off voltage to the word lines in a plurality of groups in the unit of group according to the arrangement order of the memory cells coupled to the plurality of word lines in the memory array.

In some examples, the peripheral circuit 1300 is further configured to:

sequentially reduce the precharge voltages applied to the plurality of word lines to a first intermediate voltage according to the arrangement order of the memory cells coupled to the plurality of word lines in the memory array, wherein the first intermediate voltage is a voltage between the precharge voltage and the first turn-off voltage;

sequentially reduce the first intermediate voltages applied to the plurality of word lines to the first turn-off voltage according to the arrangement order of the memory cells coupled to the plurality of word lines in the memory array.

In some examples, the peripheral circuit 1300 is further configured to:

sequentially reduce the precharge voltages applied to the plurality of word lines to the first turn-off voltage along the direction from the drain selection gate to the source selection gate; or sequentially reduce the precharge voltages applied to the plurality of word lines to the first turn-off voltage along the direction from the source selection gate to the drain selection gate.

In some examples, the plurality of word lines include a selected word line coupled to the memory cell to be programmed and a deselected word line coupled to the programmed memory cell.

In some examples, the peripheral circuit 1300 is further configured to:

apply a verification voltage to the selected word line in the plurality of word lines, and apply a read voltage to other word lines in the plurality of word lines;

sequentially apply a second turn-off voltage to the plurality of word lines according to the arrangement order of the memory cells coupled to the plurality of word lines in the memory array;

apply a program voltage to the selected word line in the plurality of word lines, and apply a turn-on voltage to other word lines in the plurality of word lines.

In some examples, the peripheral circuit 1300 is further configured to:

sequentially reduce the verification voltages or read voltages applied to the plurality of word lines to a second intermediate voltage according to the arrangement order of the memory cells coupled to the plurality of word lines in the memory array; wherein the second intermediate voltage is a voltage between the verification voltage and the second turn-off voltage, or the second intermediate voltage is a voltage between the read voltage and the second turn-off voltage;

sequentially reduce the second intermediate voltages applied to the plurality of word lines to the second turn-off voltage according to the arrangement order of the memory cells coupled to the plurality of word lines in the memory array.

In some examples, the peripheral circuit 1300 is further configured to:

sequentially reduce the precharge voltages applied to a portion of the plurality of word lines to the first turn-off voltage with a preset word line interval according to the arrangement order of the memory cells coupled to the plurality of word lines in the memory array.

In some examples, the peripheral circuit 1300 is further configured to:

determine a plurality of target word lines from the plurality of word lines according to a preset interval algorithm, wherein two adjacent target word lines are separated with at least one word line;

sequentially reduce the precharge voltages applied to the plurality of target word lines to the first turn-off voltage according to the arrangement order of the memory cells coupled to the plurality of target word lines in the memory array.

In some examples, the peripheral circuit 1300 is further configured to:

after the plurality of word lines are reduced to the first turn-off voltage, apply a program voltage to the selected word line in the plurality of word lines, and apply a turn-on voltage to other word lines in the plurality of word lines at the same time.

An example of the present application provides an electronic device, the electronic device comprising:

one or more memories as described in any of the above examples, and, a memory controller coupled to the memory and configured to control the memory.

An example of the present application provides a computer-readable memory medium, the computer-readable memory medium stores instructions, and when the instructions are executed on the control circuit, the memory programming method provided in the above example of the present application is implemented.

In the present application, the terms “first” and “second” are used for descriptive purposes only and cannot be understood as indicating or implying relative importance. The term “at least one” means one or more, and the term “multiple” means two or more, unless otherwise clearly defined.

In the present application, the term “and/or” is only a description of the association relationship of the associated objects, indicating that there can be three relationships. For example, A and/or B can represent: A exists alone, A and B exist at the same time, and B exists alone. In addition, the character "/" in this article generally indicates that the associated objects before and after are in an "or" relationship.

The above description is only an illustrated example of the present application and is not intended to limit the present application. Any modifications, equivalent substitutions, improvements, etc. made within the spirit and principles of the present application shall be included in the protection scope of the present application.

What is claimed is:

1. A memory comprising:

a memory array comprising a plurality of memory cells coupled to a first bit line and to a plurality of word lines respectively, wherein the plurality of word lines comprises a selected word line coupled to a memory cell to be programmed; and a peripheral circuit configured to:

apply precharge voltages to the plurality of word lines;

sequentially reduce the precharge voltages applied to the plurality of word lines to a first turn-off voltage according to an arrangement order of memory cells coupled to the plurality of word lines in the memory array;

apply a program voltage to the selected word line in the plurality of word lines; and apply a turn-on voltage to other word lines besides the selected word line in the plurality of word lines.

2. The memory of claim 1, wherein the peripheral circuit is further configured to:

apply the first turn-off voltage to the plurality of word lines one by one according to the arrangement order of the memory cells coupled to the plurality of word lines in the memory array.

3. The memory of claim 2, wherein the peripheral circuit is further configured to:

obtain group configuration information of the plurality of word lines, the group configuration information including a plurality of groups which the plurality of word lines are divided into, wherein at least two word lines in a same group of the plurality of groups are arranged consecutively in the memory array; and sequentially apply the first turn-off voltage to the word lines in each of the plurality of groups according to the arrangement order of the memory cells coupled to the plurality of word lines in the memory array.

4. The memory of claim 1, wherein the peripheral circuit is further configured to:

sequentially reduce the precharge voltages applied to the plurality of word lines to a first intermediate voltage according to the arrangement order of the memory cells coupled to the plurality of word lines in the memory array, wherein the first intermediate voltage is between the precharge voltages and the first turn-off voltage; and sequentially reduce the first intermediate voltage applied to the plurality of word lines to the first turn-off voltage according to the arrangement order of the memory cells coupled to the plurality of word lines in the memory array.

5. The memory of claim 1, wherein the peripheral circuit is further configured to:

sequentially reduce the precharge voltages applied to the plurality of word lines to the first turn-off voltage along a direction from a drain select gate to a source select gate.

6. The memory of claim 1, wherein, the plurality of word lines include a deselected word line coupled to a programmed memory cell.

7. The memory of claim 1, wherein the peripheral circuit is further configured to:

apply a verification voltage to the selected word line in the plurality of word lines, and apply a read voltage to the other word lines in the plurality of word lines; and sequentially apply a second turn-off voltage to the plurality of word lines according to the arrangement order of the memory cells coupled to the plurality of word lines in the memory array.

8. The memory of claim 7, wherein the peripheral circuit is further configured to:

sequentially reduce at least one of the verification voltage and the read voltage to a second intermediate voltage according to the arrangement order of the memory cells coupled to the plurality of word lines in the memory array, wherein the second intermediate voltage is either between the verification voltage and the second turn-off voltage or between the read voltage and the second turn-off voltage; and sequentially reduce the second intermediate voltage applied to the plurality of word lines to the second turn-off voltage according to the arrangement order of the memory cells coupled to the plurality of word lines in the memory array.

9. The memory of claim 1, wherein the peripheral circuit is further configured to:

sequentially reduce the precharge voltages applied to a portion of the plurality of word lines to the first turn-off voltage with a preset word line interval according to the arrangement order of the memory cells coupled to the plurality of word lines in the memory array.

10. The memory of claim 9, wherein the peripheral circuit is further configured to:

determine a plurality of target word lines from the plurality of word lines according to a preset interval algorithm, wherein two target word lines of the plurality of target word lines are separated with at least one word line; and sequentially reduce the precharge voltages applied to the plurality of target word lines to the first turn-off voltage according to the arrangement order of the memory cells coupled to the plurality of target word lines in the memory array.

11. The memory of claim 1, wherein the peripheral circuit is further configured to:

after the first turn-off voltage is applied to the plurality of word lines, apply the program voltage to the selected word line in the plurality of word lines, and apply the turn-on voltage to the other word lines in the plurality of word lines at the same time.

12. A method of programming a memory, comprising:

applying precharge voltages to a plurality of word lines;

sequentially reducing the precharge voltages applied to the plurality of word lines to a first turn-off voltage according to an arrangement order of memory cells coupled to the plurality of word lines in a memory array;

applying a program voltage to a selected word line in the plurality of word lines; and applying a turn-on voltage to other word lines besides the selected word line in the plurality of word lines.

13. The method of claim 12, wherein sequentially reducing the precharge voltages applied to the plurality of word lines to the first turn-off voltage according to the arrangement order of memory cells coupled to the plurality of word lines in the memory array comprises:

applying the first turn-off voltage to the plurality of word lines one by one according to the arrangement order of the memory cells coupled to the plurality of word lines in the memory array.

14. The method of claim 12, wherein sequentially reducing the precharge voltages applied to the plurality of word lines to the first turn-off voltage according to the arrangement order of memory cells coupled to the plurality of word lines in the memory array comprises applying the first turn-off voltage to the plurality of word lines in groups according to the arrangement order of the memory cells coupled to the plurality of word lines in the memory array, and wherein applying the first turn-off voltage to the plurality of word lines in groups according to the arrangement order of the memory cells coupled to the plurality of word lines in the memory array comprises:

obtaining group configuration information of the plurality of word lines, the group configuration information including a plurality of groups which the plurality of word lines are divided into, wherein at least two word lines in a same group of the plurality of groups are arranged consecutively in the memory array; and sequentially applying the first turn-off voltage to word lines in each of the plurality of groups according to the arrangement order of the memory cells coupled to the plurality of word lines in the memory array.

15. The method of claim 12, wherein sequentially reducing the precharge voltages applied to the plurality of word lines to the first turn-off voltage according to the arrangement order of memory cells coupled to the plurality of word lines in the memory array comprises:

sequentially reducing the precharge voltages applied to the plurality of word lines to a first intermediate voltage according to the arrangement order of the memory cells coupled to the plurality of word lines in the memory array, wherein the first intermediate voltage is between the precharge voltages and the first turn-off voltage; and sequentially reducing the first intermediate voltage applied to the plurality of word lines to the first turn-off voltage according to the arrangement order of the memory cells coupled to the plurality of word lines in the memory array.

16. The method of claim 12, wherein sequentially reducing the precharge voltages applied to the plurality of word lines to the first turn-off voltage according to the arrangement order of memory cells coupled to the plurality of word lines in the memory array comprises:

sequentially reducing the precharge voltages applied to the plurality of word lines to the first turn-off voltage along a direction from a source select gate to a drain select gate.

17. The method of claim 12, wherein the selected word line is coupled to a memory cell to be programmed and a deselected word line is coupled to a programmed memory cell.

18. The method of claim 12, further comprising:

applying a verification voltage to the selected word line in the plurality of word lines, and applying a read voltage to the other word lines in the plurality of word lines; and sequentially applying a second turn-off voltage to the plurality of word lines according to the arrangement order of the memory cells coupled to the plurality of word lines in the memory array.

19. The method of claim 12, wherein sequentially reducing the precharge voltages applied to the plurality of word lines to the first turn-off voltage according to the arrangement order of memory cells coupled to the plurality of word lines in the memory array comprises:

sequentially reducing the precharge voltages applied to a portion of the plurality of word lines to the first turn-off voltage with a preset word line interval according to the arrangement order of the memory cells coupled to the plurality of word lines in the memory array.

20. A memory system, comprising:

one or more memories comprising:

a memory array comprising a plurality of memory cells coupled to a first bit line and to a plurality of word lines respectively, wherein the plurality of word lines comprises a selected word line coupled to a memory cell to be programmed; and a peripheral circuit configured to:

apply precharge voltages to the plurality of word lines;

sequentially reduce the precharge voltages applied to the plurality of word lines to a first turn-off voltage according to an arrangement order of memory cells coupled to the plurality of word lines in the memory array;

apply a program voltage to the selected word line in the plurality of word lines; and apply a turn-on voltage to other word lines besides the selected word line in the plurality of word lines; and a memory controller coupled to the one or more memories and configured to control the one or more memories.

* * * * *